United States Patent
Diffenderfer et al.

(10) Patent No.: US 9,443,572 B2
(45) Date of Patent: Sep. 13, 2016

(54) PROGRAMMABLE POWER FOR A MEMORY INTERFACE

(71) Applicant: QUALCOMM Incorporated, San Diego, CA (US)

(72) Inventors: Jan Christian Diffenderfer, Escondido, CA (US); Yuehchun Claire Cheng, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/298,730

(22) Filed: Jun. 6, 2014

(65) Prior Publication Data
US 2015/0357017 A1   Dec. 10, 2015

(51) Int. Cl.
| G11C 7/00 | (2006.01) |
| G11C 11/4076 | (2006.01) |
| H03L 7/08 | (2006.01) |
| G11C 7/10 | (2006.01) |
| H03L 7/081 | (2006.01) |

(52) U.S. Cl.
CPC ......... *G11C 11/4076* (2013.01); *G11C 7/1066* (2013.01); *G11C 7/1093* (2013.01); *H03L 7/08* (2013.01); *H03L 7/0805* (2013.01); *H03L 7/0812* (2013.01)

(58) Field of Classification Search
USPC ....................................................... 365/194
See application file for complete search history.

(56) References Cited

U.S. PATENT DOCUMENTS

| 6,430,606 B1 | 8/2002 | Haq |
| 6,859,109 B1 | 2/2005 | Leung et al. |
| 2007/0291828 A1 | 12/2007 | Martin et al. |
| 2009/0085618 A1* | 4/2009 | Schneider et al. ............ 327/143 |
| 2009/0085623 A1* | 4/2009 | Schneider ................. H03L 7/07 327/161 |
| 2010/0033217 A1 | 2/2010 | Shiah et al. |
| 2010/0219867 A1 | 9/2010 | Choi et al. |
| 2013/0121094 A1 | 5/2013 | Zerbe et al. |
| 2013/0249612 A1 | 9/2013 | Zerbe et al. |
| 2013/0257529 A1 | 10/2013 | Komninakis et al. |
| 2014/0019792 A1 | 1/2014 | Oh et al. |

OTHER PUBLICATIONS

International Search Report and Written Opinion—PCT/US2015/030214—ISA/EPO—Jul. 23, 2015.

\* cited by examiner

*Primary Examiner* — Hoai V Ho
(74) *Attorney, Agent, or Firm* — Loza & Loza LLP

(57) ABSTRACT

Systems and methods for delay control are described herein. In one embodiment, a delay system comprises a first delay circuit configured to provide a voltage bias to a second delay circuit, wherein the voltage bias controls a delay of the second delay circuit, and to update the voltage bias at an update rate. The delay system also comprises an update controller configured to adjust the update rate of the first delay circuit. For example, the update controller may adjust the update rate based on timing requirements of a memory interface incorporating the delay system. The update rate may be reduced when the timing requirements are more relaxed to reduce power, and may be increased when the timing requirements are tighter.

30 Claims, 21 Drawing Sheets

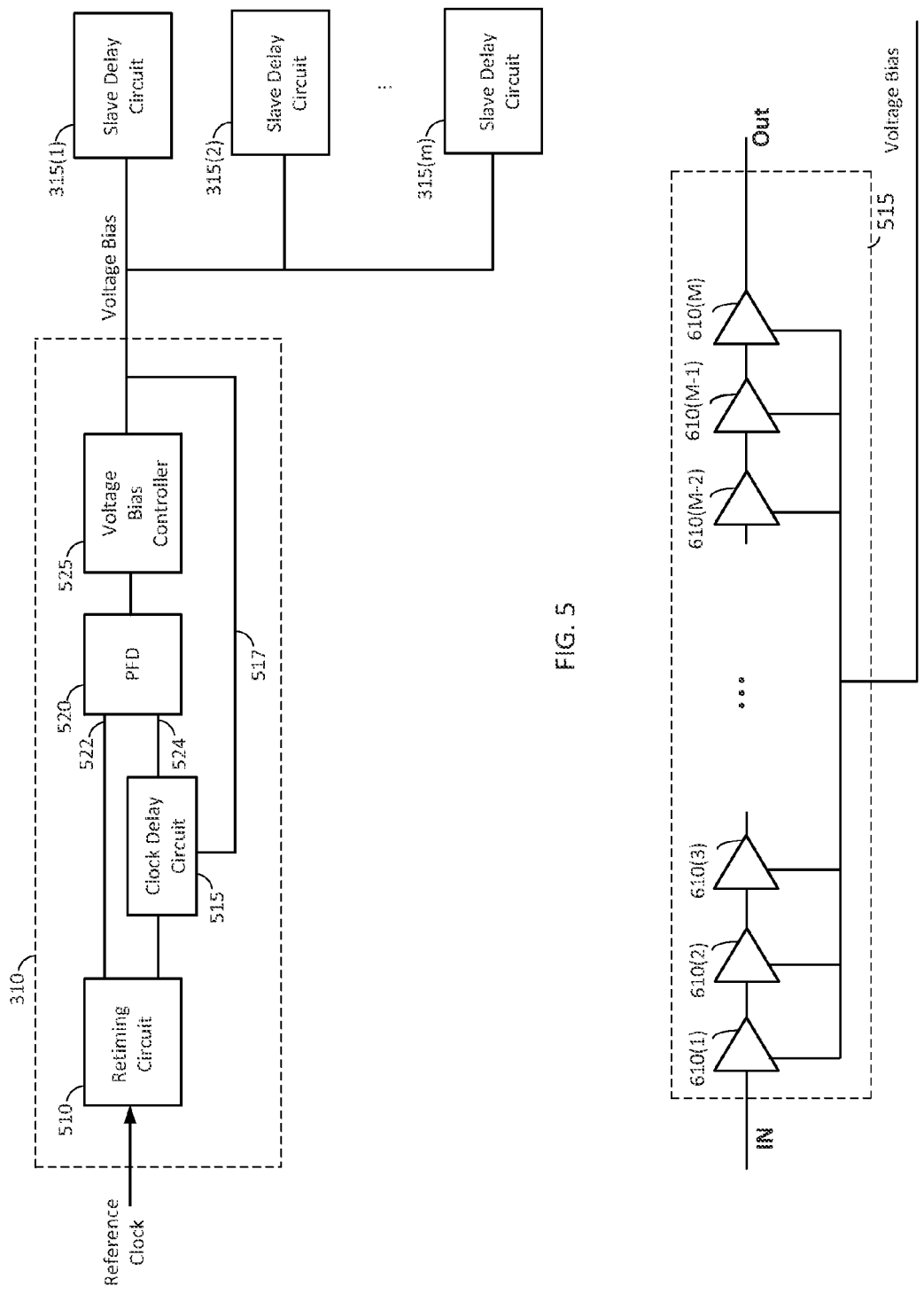

PROGRAMMABLE POWER FOR A MEMORY INTERFACE

BACKGROUND

1. Field

Aspects of the present disclosure relate generally to memory, and more particularly, to programmable power for a memory interface.

2. Background

A chip may include a memory interface for interfacing circuits (e.g., a memory controller) on the chip with an external memory device, such as a double data rate dynamic random access memory (DDR DRAM). The memory interface may include delay circuits for adjusting the timing of signals (e.g., data signals) in the memory interface. For example, the memory interface may include delay circuits to compensate for skew between data signals (e.g., due to mismatches in the lengths of data lines between the memory interface and the external memory device). In another example, the memory interface may include a delay circuit to center a data strobe signal used for data sampling between transitions of the data signals.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to an aspect, a delay system is described herein. The delay system comprises a first delay circuit configured to provide a voltage bias to a second delay circuit, wherein the voltage bias controls a delay of the second delay circuit, and to update the voltage bias at an update rate. The delay system also comprises an update controller configured to adjust the update rate of the first delay circuit.

A second aspect relates to a method for delay control. The method comprises providing a voltage bias to a delay circuit, wherein the voltage bias controls a delay of the delay circuit. The method also comprises updating the voltage bias at an update rate, and adjusting the update rate.

A third aspect relates to an apparatus for delay control. The apparatus comprises means for providing a voltage bias to a delay circuit, wherein the voltage bias controls a delay of the delay circuit. The apparatus also comprises means for updating the voltage bias at an update rate, and means for adjusting the update rate.

A fourth aspect relates to a memory interface. The memory interface comprises a first delay circuit configured to delay a signal, wherein the signal comprises one of a data signal and a data strobe signal. The memory interface also comprises a second delay circuit configured to provide a voltage bias to the first delay circuit, wherein the voltage bias controls a delay of the first delay circuit, and to update the voltage bias at an update rate. The memory interface further comprises an update controller configured to adjust the update rate of the second delay circuit.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

BRIEF DESCRIPTION OF THE DRAWINGS

FIG. 5 shows an example of a master delay circuit according to an embodiment of the present disclosure.

FIG. 6 shows an example of a clock delay circuit according to an embodiment of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
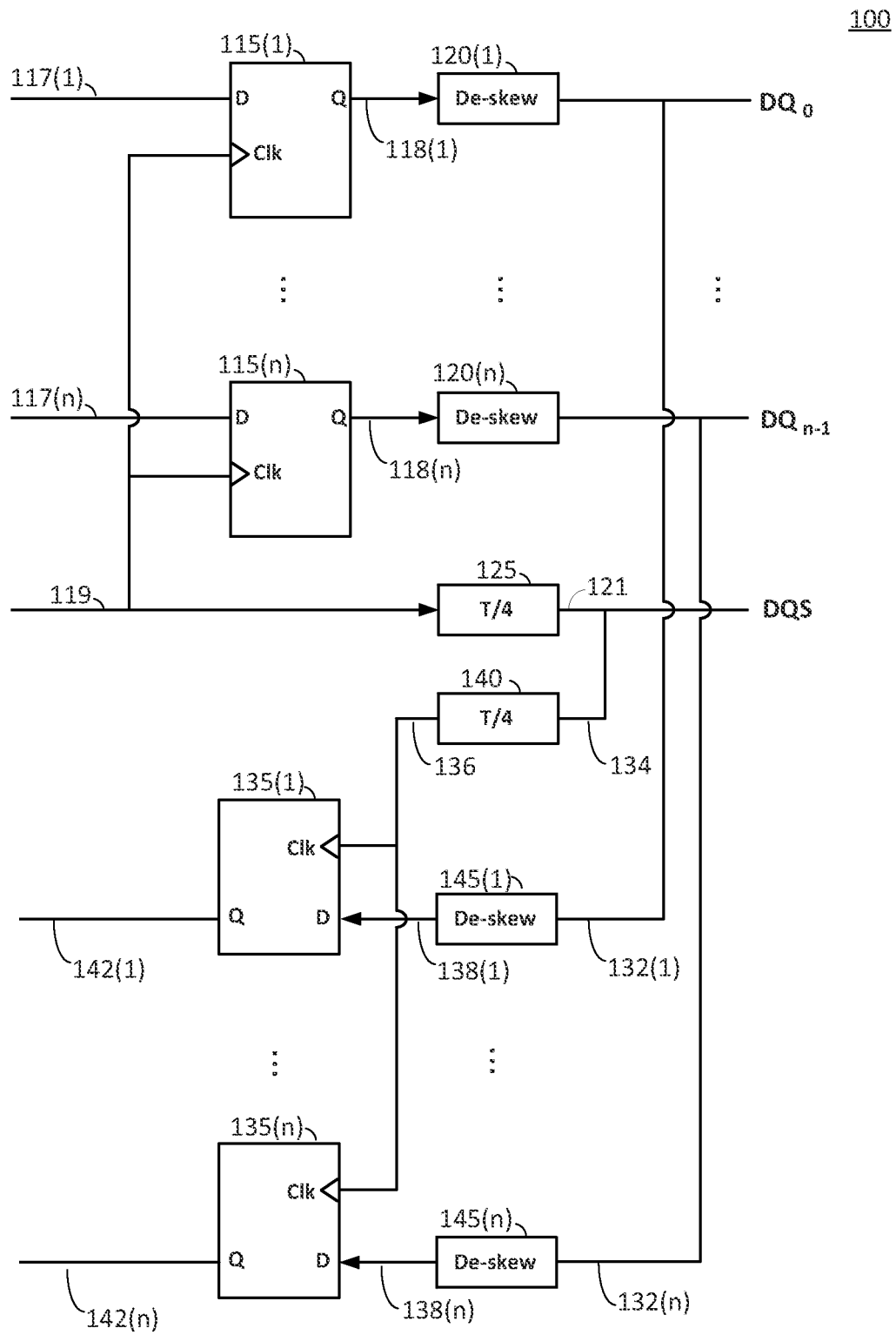
FIG. 1 shows an example of a memory interface for interfacing with an external memory device.

A chip may include a memory interface for interfacing circuits (e.g., a memory controller) on the chip with an external memory device, such as a DDR DRAM. FIG. 1 shows an exemplary memory interface 100 for interfacing a chip with an external memory device (not shown). The memory interface 100 includes a first plurality of flip-flops 115(1)-115(n), a first plurality of de-skew circuits 120(1)-120(n), a second plurality of flip-flops 135(1)-135(n), a second plurality of de-skew circuits 145(1)-145(n), a first delay circuit 125, and a second delay circuit 140.

During write operations, the first plurality of flip-flops 115(1)-115(n) receive a plurality of data signals 117(1)-117(n) in parallel. Each flip-flop 115(1)-115(n) also receives a data strobe signal 119, which may be a periodic signal having half the frequency of the incoming data signals 117(1)-117(n). Each flip-flop 115(1)-115(n) captures data bits from the respective data signal 117(1)-117(n) on the rising and falling edges of the data strobe signal 119, and outputs the captured data bits to the respective de-skew circuit 120(1)-120(n), which is described in more detail below.

The data strobe signal 119 is also input to the first delay circuit 125. Before the first delay circuit 125, the edges of the data strobe signal 119 are approximately aligned with transitions of the output data signals 118(1)-118(n) of the flip-flops 115(1)-115(n). This is because each flip-flop 115(1)-115(n) captures data bits for the respective output data signal 118(1)-118(n) on the rising and falling edges of the data strobe signal 119. The first delay circuit 125 delays the data strobe signal 119 by a quarter of a period so that the edges of the delayed data strobe signal 121 are approximately centered between transitions of the output data signals 118(1)-118(n).

Figure 2:
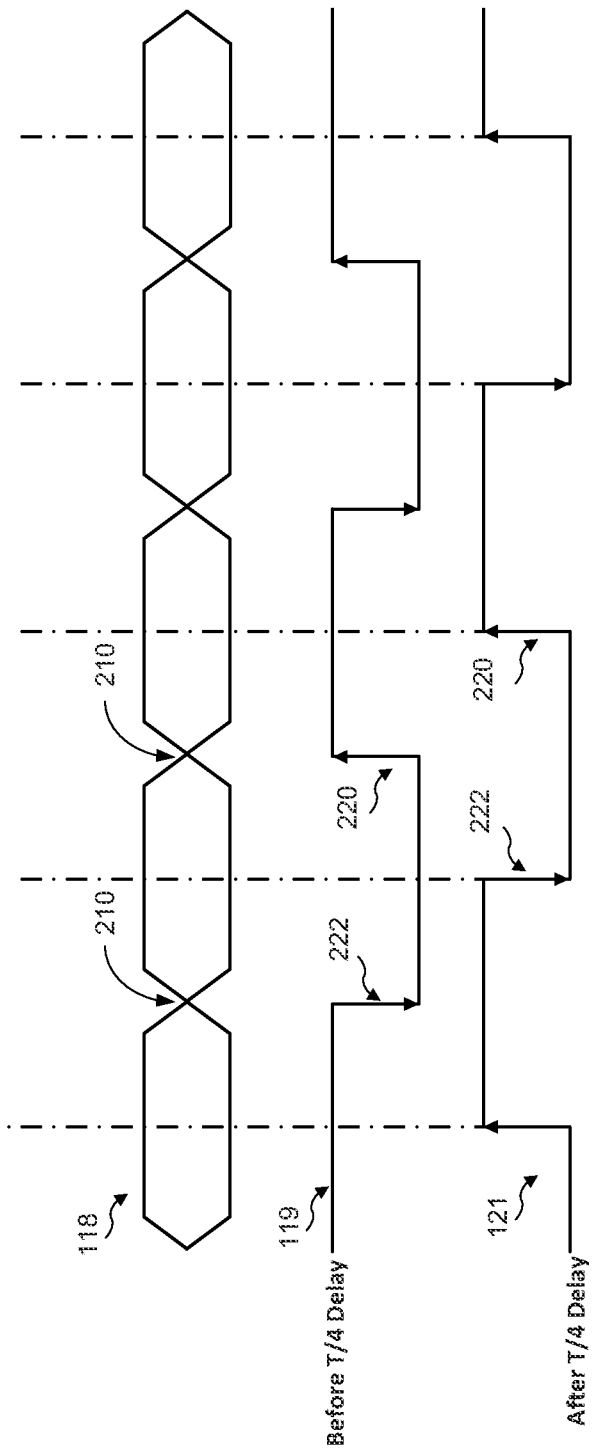
FIG. 2 is a timing diagram illustrating an example of timing between a data signal and a data strobe.

FIG. 2 shows a simplified example of the timing relationship between one of the output data signals 118 and the data strobe signal 119. In this example, the rising and falling edges 220 and 222 of the data strobe signal 119 are approximately aligned with transitions 210 of the output data signal 118. After being delayed by a quarter of a period (T/4), the rising and falling edges 220 and 222 of the data strobe signal 121 are approximately centered between transitions 210 of the output data signal 118, as shown in FIG. 2. The memory device samples the data signal at the edges of the data strobe signal 121. Centering the edges of the data strobe signal 121 between transitions of the data signal helps ensure that the memory device samples the data signal within the valid data window of the data signal.

Each de-skew circuit 120(1)-120(n) adds a small amount of delay to the respective data signal 118(1)-118(n) to compensate for skew between the data signals in going from the memory interface 100 to the memory device (e.g., DDR DRAM). The skew may be due to mismatches in the lengths of the lines used to transport the data signals to the memory device and/or another cause. After being delayed by the respective de-skew circuit 120(1)-120(n), each output data signal is output to the memory device on a respective bi-directional data line $DQ_0$-$DQ_{n-1}$. The data strobe signal 121 is output to the memory device on a bi-directional strobe line DQS. The memory device uses the data strobe signal 121 to sample the data signals received from the memory interface 100.

During read operations, the memory interface 100 receives a plurality of data signals 132(1)-132(n) from the memory device via the bi-directional data lines $DQ_0$-$DQ_{n-1}$ and a data strobe signal 134 from the memory device via the bi-directional strobe line DQS. Each of the second plurality of de-skew circuits 145(1)-145(n) receives one of the data signals 132(1)-132(n) and adds a small amount of delay to the respective data signal to compensate for skew between the data signals.

The data strobe signal 134 from the memory device is input to the second delay circuit 140, which delays the data strobe signal 134 by a quarter of a period. This is done because the memory device outputs the data strobe signal 134 with the edges of the data strobe signal aligned with transitions of the data signals 132(1)-132(n). By delaying the data strobe signal 134 by a quarter of a period, the second delay circuit 140 approximately centers the edges of the delayed data strobe signal 136 between transitions of the data signals 132(1)-132(n).

The delayed data strobe 136 is then input to the clock input of each of the second plurality of flip-flops 135(1)-135(n). For example, the delayed data strobe signal 136 may be distributed to the clock inputs of the flip-flops 135(1)-135(n) using a clock tree. Each flip-flop 135(1)-135(n) captures data bits from the output 138(1)-138(n) of the respective de-skew circuit 145(1)-145(n) on the rising and falling edges of delayed data strobe signal 136. The resulting output data signals 142(1)-142(n) may be sent to additional circuitry (not shown) in the memory interface 100 for further processing.

The memory interface 100 may support multiple data rates, in which the rate at which data is sent to and received from the memory device can be dynamically adjusted. For example, the data rate may be increased for applications requiring a high data rate, and may be decreased for applications that do not require a high data rate. When the data rate changes, the delays of the delay circuits 125 and 140 need to be adjusted accordingly. For example, when the data rate is doubled, the period of the data strobe signal 119 is reduced in half. In this example, the delay of the first delay circuit 125 is reduced in half to maintain a delay of a quarter of a period for the data strobe signal 119. In another example, when the data rate is reduced in half, the period of the data strobe signal 119 is doubled. In this example, the delay of the first delay circuit 125 is doubled to maintain a delay of a quarter of a period for the data strobe signal 119.

Figure 3:
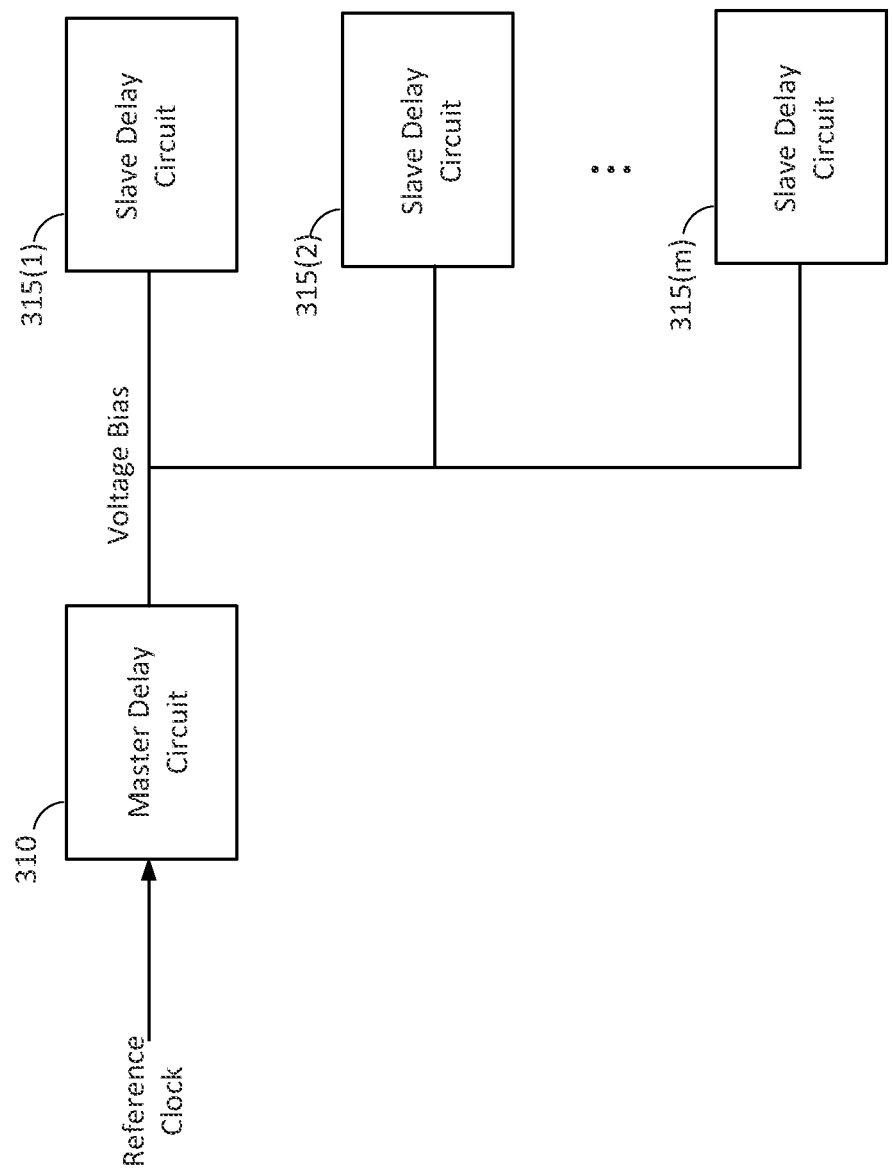
FIG. 3 shows an example of a master-slave architecture according to an embodiment of the present disclosure.

FIG. 3 shows an example of a master-slave architecture 300 for providing controlled delays in a memory interface (e.g., memory interface 100). The master-slave architecture 300 comprises a master delay circuit 310 and a plurality of slave delay circuits 315(1)-315(m). Each slave delay circuit 315(1)-315(m) provides a delay that is a multiple of a step delay, in which the step delay is controlled by a voltage bias from the master delay circuit 310. The master delay circuit 310 adjusts the voltage bias based on a reference clock (e.g., from a crystal oscillator) to maintain a desired step delay for the slave delay circuits 315(1)-315(m), as discussed further below. The slave delay circuits 315(1)-315(m) may be used to implement the delay circuits 125 and 140 and the de-skew circuits 120(1)-120(n) and 145(1)-145(n) shown in FIG. 1.

Figure 4:
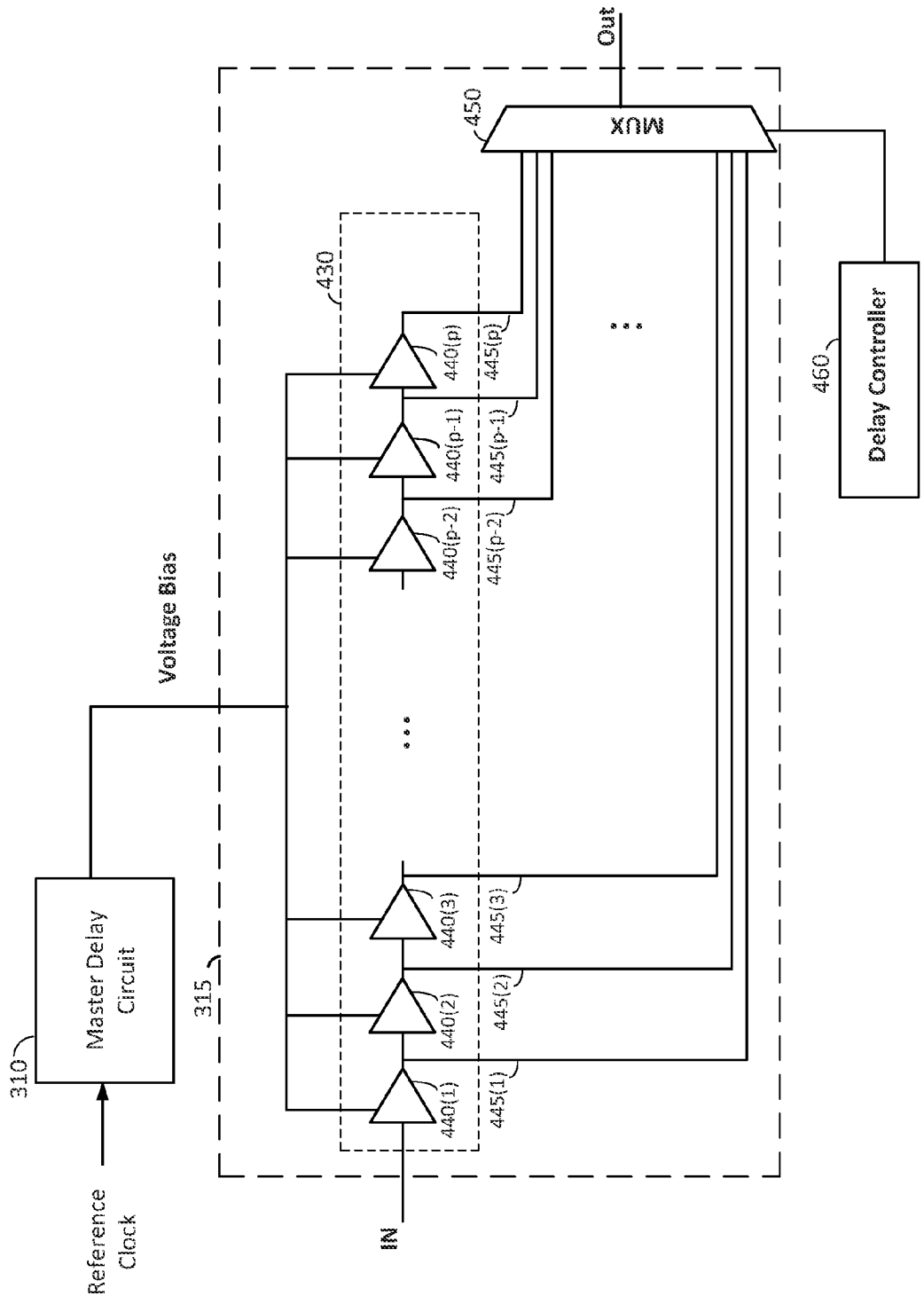
FIG. 4 shows an example of a slave delay circuit according to an embodiment of the present disclosure.

FIG. 4 shows an exemplary implementation of one of the slave delay circuits 315. The slave delay circuit 315 comprises a plurality of delay elements 440(1)-440(p) (e.g., buffers), and a multiplexer 450. Each of the delay elements 440(1)-440(p) is biased with the voltage bias from the master delay circuit 310. The voltage bias controls the delay of each delay element 440(1)-440(p).

The delay elements 440(1)-440(p) are coupled in series to form a delay chain 430, in which the output 445(1)-445(p) of each delay element 440(1)-440(p) provides a different amount of delay to the signal received at the input (denoted "IN") of the slave delay circuit 315. More particularly, the output 445(1)-445(p) of each delay element 440(1)-440(p) provides a delay that is a different multiple of a step delay, where the step delay is the delay of one delay element. For example, output 445(1) provides a delay equal to one step delay, output 445(2) provides a delay equal to two step delays, output 445(3) provides a delay equal to three step delays, and so forth.

The outputs 445(1)-445(p) of the delay elements 440(1)-440(p) are coupled to the multiplexer 450, which selects one of the outputs 445(1)-445(p) under the control of a delay controller 460. The multiplexer 450 couples the selected output to the output (denoted "OUT") of the slave delay circuit 315. The delay controller 460 controls the delay of the delay circuit 315 by instructing the multiplexer 450 to select the output 445(1)-445(p) of the delay element 440 (1)-440(p) corresponding to the desired delay.

Thus, the delay controller 460 adjusts the delay of the slave delay circuit 315 by controlling the number of delay elements 440(1)-440(p) through which the input signal passes. This allows the delay controller 460 to control the delay by multiples of the step delay, where the step delay is the delay of one delay element. The step delay is controlled by the voltage bias from the master delay circuit 310, as discussed above. The slave delay circuit 315 in FIG. 4 may be used to implement any one of the delay circuits 125 and 140 and the de-skew circuits 120(1)-120(n) and 145(1)-145 (n) shown in FIG. 1. Examples of other implementations of the slave delay circuits are discussed below.

FIG. 5 shows an exemplary implementation of the master delay circuit 310. In this example, the master delay circuit 310 is a delay locked loop (DLL) comprising a retiming circuit 510, a clock delay circuit 515, a phase frequency detector (PFD) 520, and a voltage bias controller 525. As discussed further below, the voltage bias output of the master delay circuit 310 is fed back to the clock delay circuit 515 by a feedback loop 517 to achieve a desired step delay.

In operation, the retiming circuit 510 receives the reference clock, delays the reference clock by one clock period, and outputs the delayed reference clock to a first input 522 of the PFD 520. The retiming circuit 510 also outputs the reference clock to the clock delay circuit 515. The clock delay circuit 515 delays the reference clock by an amount controlled by the voltage bias, which is fed back to the clock delay circuit 515 from the output of the master delay circuit 310 by the feedback loop 517. The clock delay circuit 515 outputs the resulting delayed reference clock to a second input 524 of the PFD 520.

The PFD 520 detects the phase error between the first and second inputs 522 and 524, and outputs a phase error signal to the voltage bias controller 525 based on the detected phase error. The voltage bias circuit 525 adjusts the voltage bias in a direction that reduces the phase error. The voltage bias circuit 525 may be implemented with a charge pump and a loop filter.

The phase error approaches zero when the delay of the clock delay circuit 515 is approximately equal to one period of the reference clock. Thus, the voltage bias controller 525 adjusts the voltage bias such that the delay of the clock delay circuit 515 is approximately equal to one clock period. In one aspect, the clock delay circuit 515 has a delay that is approximately equal to a multiple M of the step delay of the slave delay circuits 315(1)-315(m). Thus, in this aspect, the master delay circuit 310 adjusts the voltage bias to maintain a step delay of approximately T/M, where T is one clock period (cycle).

In one aspect, the reference clock is provided by a crystal oscillator (XO). The crystal oscillator is capable of generating a reference clock that is approximately temperature, voltage and/or process invariant. Since the master delay circuit 310 uses the reference clock as a reference for adjusting the voltage bias, the master delay circuit 310 is able to adjust the voltage bias to maintain a step delay that is approximately temperature, voltage and/or process invariant.

FIG. 6 shows an exemplary implementation of the clock delay circuit 515. In this example, the clock delay circuit 515 comprises M delay elements 610(1)-610(m) coupled in series, in which each delay element 610(1)-610(m) is biased by the voltage bias from the voltage bias controller 525. The delay elements 610(1)-610(m) in the clock delay circuit 515 may be replicas of the delay elements 440(1)-440(p) in the slave delay circuits 315(1)-315(m).

The master delay circuit 310 may update the voltage bias during each period of the reference clock. In particular, the PFD 520 may detect a phase error between the first input 522 and the second input 524 during each clock period (cycle), and output the detected phase error to the voltage bias controller 525 to update the voltage bias. However, updating the voltage bias during each clock period (cycle) may consume a relatively large amount of power, which reduces battery life when the memory interface is implemented in a mobile device.

Embodiments of the present disclosure provide programmable power for a master delay circuit, in which the power consumption of the master delay circuit is adjusted by adjusting the rate at which the master delay circuit updates the voltage bias to the slave delay circuits. For example, the master delay circuit may update the voltage bias less frequently to reduce power consumption when performance requirements are lower (e.g., lower data rates), as discussed further below.

Figure 7:
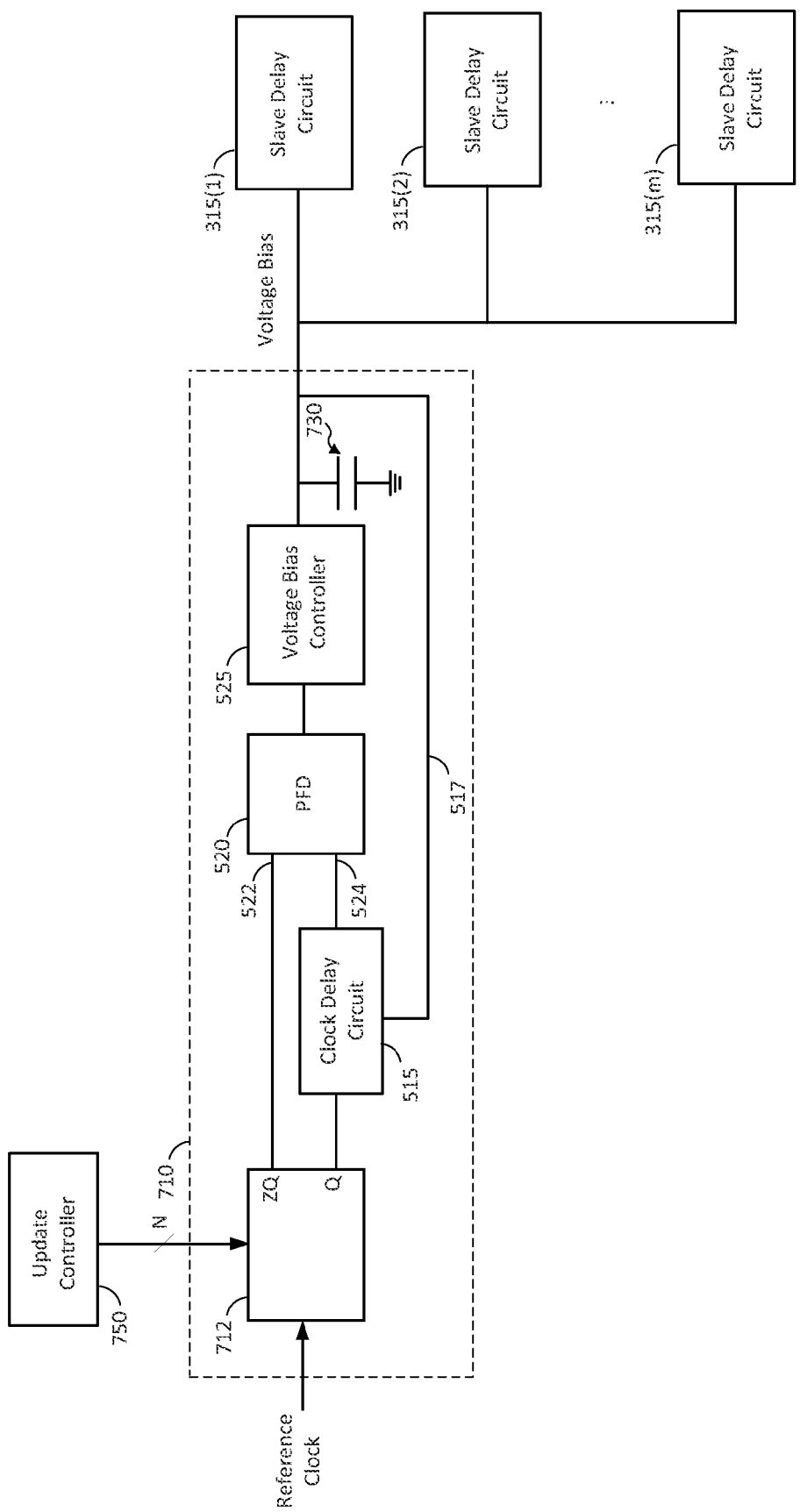
FIG. 7 shows a master delay circuit with programmable power according to an embodiment of the present disclosure.

FIG. 7 shows a master delay circuit 710 with programmable power according to an embodiment of the present disclosure. The master delay circuit 710 is a delay locked loop (DLL) comprising the clock delay circuit 515, the phase frequency detector (PFD) 520, and the voltage bias controller 525. The master delay circuit 710 further comprises an update circuit 712 and an output capacitor 730.

The update circuit 712 is configured to control the rate at which the master delay circuit 710 updates the voltage bias based on a control signal N from an update controller 750, where N is programmable and may be an integer. More particularly, the update circuit 712 causes the master delay circuit 710 to update the voltage bias every N periods (cycles) of the reference clock (i.e., a rate of one voltage bias update per N periods). For example, if N equals two, then the master delay circuit 710 updates the voltage bias every two clock periods (cycles).

The update circuit 712 may be used to adjust the power consumption of the master delay circuit 710 by adjusting the rate at which the voltage bias is updated. For example, the update controller 750 may reduce the power consumption of the master delay circuit 710 by increasing N (i.e., reducing the rate at which the voltage bias is updated).

In operation, the update circuit 712 outputs a pair of pulses every N periods (cycles) of the reference clock. Each pair of pulses comprises a Q pulse and a ZQ pulse, in which the ZQ pulse is delayed by approximately one clock period relative to the Q pulse. For each pair of pulses, the update circuit 712 outputs the ZQ pulse to the first input 522 of the PFD 520 and outputs the Q pulse to the clock delay circuit 515. The clock delay circuit 515 delays the Q pulse by an amount controlled by the voltage bias, which is fed back to the clock delay circuit 515 from the output of the voltage bias controller 525 by the feedback loop 517. The clock delay circuit 515 outputs the resulting delayed Q pulse to the second input 524 of the PFD 520. The PFD 520 detects a phase error between the ZQ pulse and the delayed Q pulse. For example, the PFD 520 may detect the phase error by detecting the phase difference between the rising edges of the ZQ pulse and the delayed Q pulse or the phase difference between the falling edges of the ZQ pulse and the delayed Q pulse. The PFD 520 outputs a phase error signal to the voltage bias controller 525 based on the detected phase error. The voltage bias circuit 525 adjusts the voltage bias in a direction that reduces the phase error.

The phase error approaches zero when the delay of the clock delay circuit 515 is approximately equal to one period of the reference clock. Thus, the voltage bias controller 525 adjusts the voltage bias such that the delay of the clock delay circuit 515 is approximately equal to one period clock period. In one embodiment, the clock delay circuit 515 has a delay that is approximately equal to a multiple M of the step delay of the slave delay circuits 315(1)-315(m). Thus, in this embodiment, the master delay circuit 710 updates the voltage bias every N clock periods (cycles) to maintain a step delay of approximately T/M, where T is one clock period (cycle).

The output capacitor 730 is used to hold the voltage bias at the output of the voltage bias controller 525 between updates. The voltage bias at the output capacitor 730 may drift between updates of the voltage bias, resulting in jitter at the slave delay circuits 315(1)-315(m). The voltage bias may drift by a larger amount when the amount of time between updates increases. As a result, reducing the rate at which the master delay circuit 710 updates the voltage bias (i.e., increasing N) may reduce power consumption at the expense of lower performance (e.g., higher jitter). Thus, there may be a tradeoff between reducing the power of the master delay circuit 710 and the performance of the master delay circuit 710.

In this regard, the update controller 750 may be configured to reduce the rate of voltage bias updates (and hence reduce power) to a level that still provides adequate performance for a particular application. For example, when the memory interface operates at a relatively low data rate, the valid data window is relatively large. This relaxes the timing requirements of the memory interface, allowing the memory interface to tolerate lower performance from the master delay circuit 710 (i.e., larger voltage bias drift between updates). In this case, the update controller 750 may reduce the rate of voltage bias updates (i.e., increase N) to reduce power consumption. When the memory interface operates at a higher data rate, the valid data window is smaller and the timing requirements of the memory interference are tighter (e.g., flip-flops in the memory interface tolerate less jitter). In this case, the update controller 750 may increase the rate of voltage bias updates (i.e., decrease N) to increase performance of the master delay circuit 710. Thus, the rate at which the voltage bias is updated may be reduced when high performance is not needed to reduce power consumption, and may be increased when high performance is needed (e.g., at higher data rates).

Figure 8:
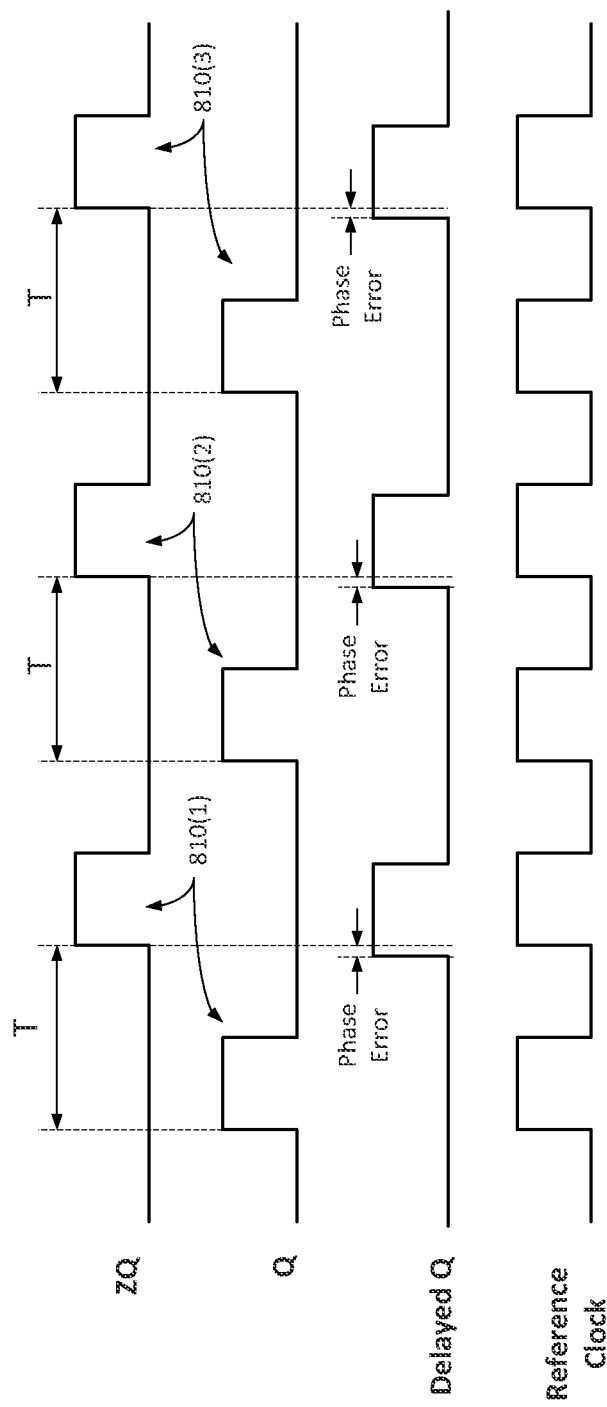
FIG. 8 is a timing diagram illustrating an example in which voltage bias is updated every two clock periods according to an embodiment of the present disclosure.

Exemplary operations of the master delay circuit 710 for two different N values will now be described with reference to FIGS. 8 and 9. FIG. 8 is a timing diagram illustrating an example where N equals two. In this example, the update circuit 712 outputs a pair of pulses 810(1)-810(3) every two periods (cycles) of the reference clock. Each pair of pulses 810(1)-810(3) comprises a Q pulse output to the clock delay circuit 515 and a ZQ pulse output to the first input 522 of the PFD 520, where the ZQ pulse is delayed by approximately one clock period relative to the Q pulse.

FIG. 8 also shows each Q pulse after the Q pulse has been delayed by the clock delay circuit 515. For each pair of pulses, the PFD 520 detects a phase error between the respective ZQ pulse and the respective delayed Q pulse (as shown in FIG. 8), and the voltage bias controller 525 updates the voltage bias based on the detected phase error. In this example, the master delay circuit 710 detects a phase error and updates the voltage bias based on the detected phase error every two periods (cycles) of the reference clock.

Although FIG. 8 shows an example in which each delayed Q pulse is early relative to the respective ZQ pulse (leads the respective ZQ pulse), it is to be appreciated that a delayed Q pulse may be late relative to the respective ZQ pulse. For the case where the delayed Q pulse is early, the voltage bias controller 525 increases the delay of the clock delay circuit 515 to reduce the phase error. For the case where the delayed Q pulse is late, the voltage bias controller 525 decreases the delay of the clock delay circuit 515 to reduce the phase error.

Figure 9:
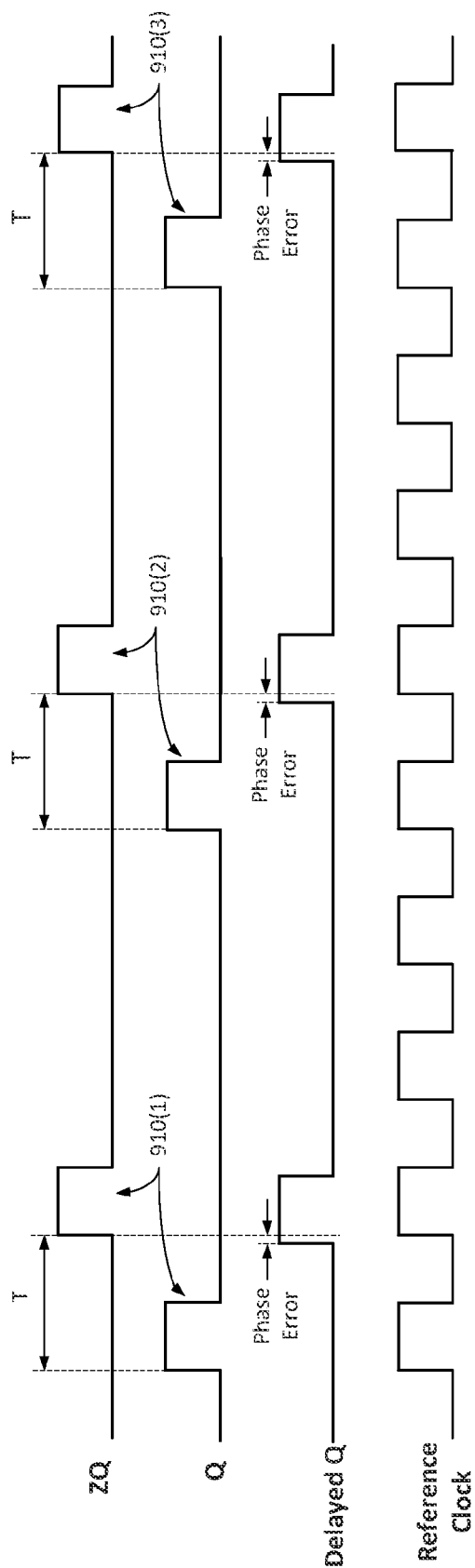
FIG. 9 is a timing diagram illustrating an example in which voltage bias is updated every four clock periods according to an embodiment of the present disclosure.

FIG. 9 is a timing diagram illustrating an example where N equals four. In this example, the update circuit 712 outputs a pair of pulses 910(1)-910(3) every four periods (cycles) of the reference clock. Each pair of pulses 910(1)-910(3) comprises a Q pulse output to the clock delay circuit 515 and a ZQ pulse output to the first input 522 of the PFD 520, where the ZQ pulse is delayed by approximately one clock period with respect to the Q pulse.

FIG. 9 also shows each Q pulse after the Q pulse has been delayed by the clock delay circuit 515. For each pair of pulses, the PFD 520 detects a phase error between the respective ZQ pulse and the respective delayed Q pulse (as shown in FIG. 9), and the voltage bias controller 525 updates the voltage bias based on the detected phase error. In this example, the master delay circuit 710 detects a phase error and updates the voltage bias based on the detected phase error every four periods (cycles) of the reference clock.

Thus, FIG. 8 shows an example in which the voltage bias is updated every two clock periods and FIG. 9 shows an example in which the voltage bias is updated every four clock periods. The example in FIG. 9 may reduce power consumption compared to the example in FIG. 8 by updating the voltage bias less frequently at the expense of more voltage bias drift between updates.

Figure 10:
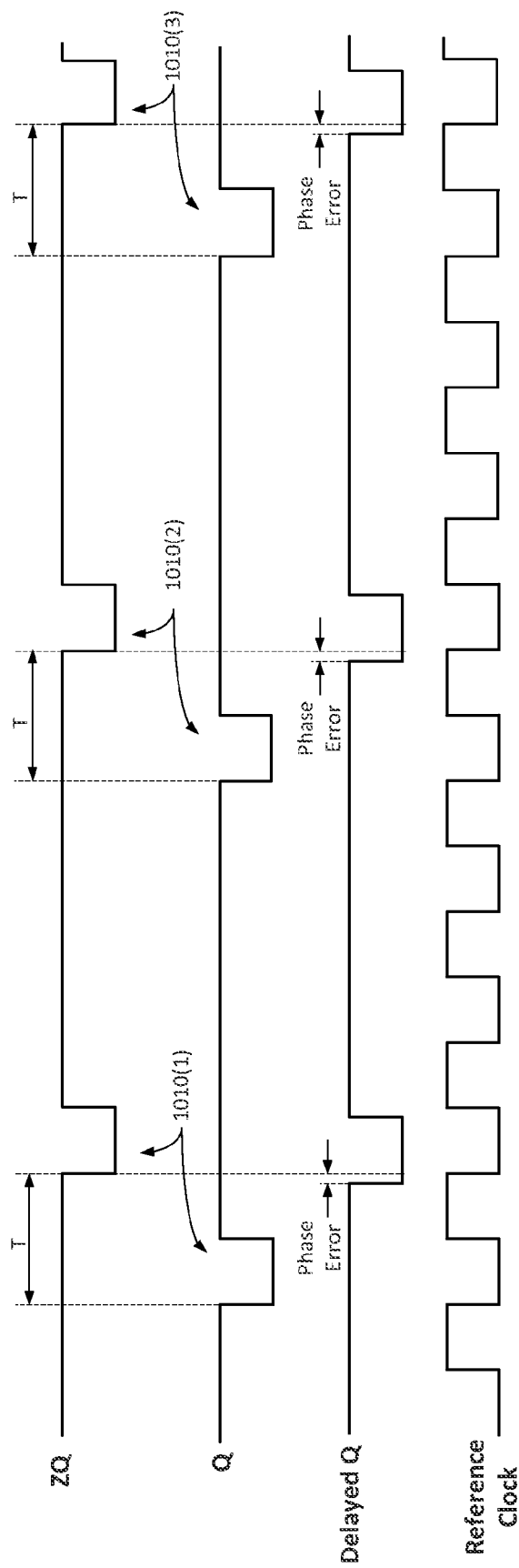
FIG. 10 is a timing diagram illustrating another example in which voltage bias is updated every four clock periods according to an embodiment of the present disclosure.

FIG. 10 is a timing diagram illustrating another example where N equals four. In this example, the update circuit 712 outputs a pair of pulses 1010(1)-1010(3) every four periods (cycles) of the reference clock. Each pair of pulses 1010(1)-1010(3) comprises a Q pulse output to the clock delay circuit 515 and a ZQ pulse output to the first input 522 of the PFD 520, where the ZQ pulse is delayed by approximately one clock period with respect to the Q pulse. This example differs from the example in FIG. 9 in that the ZQ and Q pulses are low instead of high, and the two outputs of the update circuit 712 are high between pulses instead of low.

FIG. 10 also shows each Q pulse after the Q pulse has been delayed by the clock delay circuit 515. For each pair of pulses, the PFD 520 detects a phase error between the respective ZQ pulse and the respective delayed Q pulse (as shown in FIG. 10), and the voltage bias controller 525 updates the voltage bias based on the detected phase error. It is to be appreciated that the PFD 520 may detect the phase error by detecting the phase difference between the rising edges of the pulses or the phase difference between the falling edges of the pulses (shown in FIG. 10). In this example, the master delay circuit 710 updates the voltage bias every four periods (cycles) of the reference clock.

Figure 11:
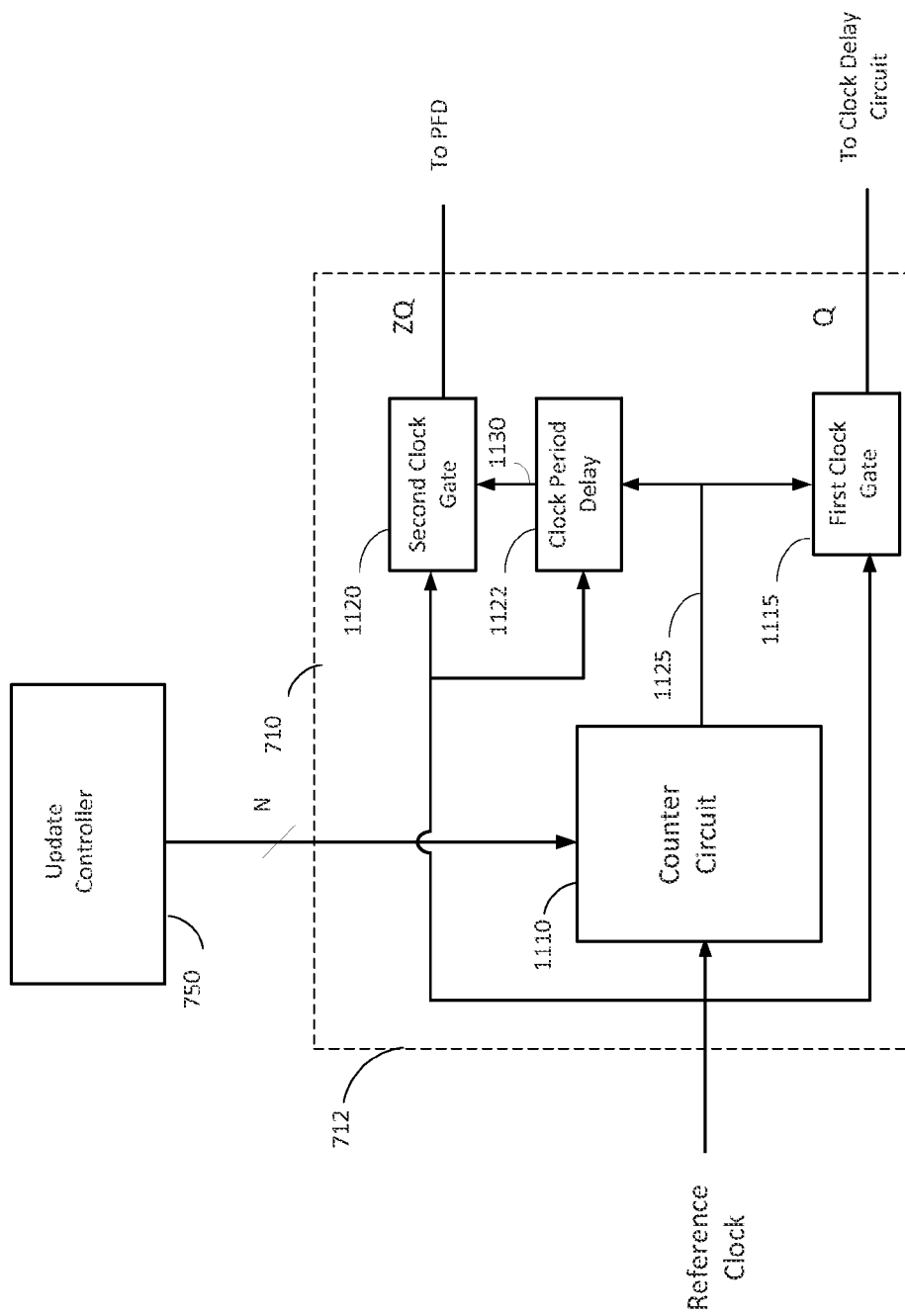
FIG. 11 shows an exemplary implementation of an update circuit according to an embodiment of the present disclosure.

FIG. 11 shows an exemplary implementation of the update circuit 712 according to an embodiment of the present disclosure. In this embodiment, the update circuit 712 comprises a programmable counter 1110, a first clock gate 1115, a second clock gate 1120, and a clock period delay circuit 1122. Each of the clock gates 1115 and 1120 receives the reference clock, and is configured to pass the reference clock when the clock gate receives a gate-enable signal and to block the reference clock when the clock gate receives a gate-disable signal, as discussed further below.

The programmable counter 1110 receives the control signal N from the update controller 750 and the reference clock. The counter 1110 is configured to output a gate-enable signal 1125 during every Nth period (cycle) of the reference clock, and to output a gate-disable signal during period(s) between every Nth period (cycle) for N greater than one. The gate-enable signal 1125 causes the first clock gate 1115 to pass the reference clock for one clock period to produce a Q pulse. The clock period delay circuit 1122 delays the gate-enable signal by one clock period, and outputs the delayed gate-enable signal 1130 to the second clock gate 1120. The delayed gate-enable signal 1130 causes the second clock gate 1120 to pass the reference clock for one clock period to produce a ZQ pulse. Since the gate-enable signal 1130 input to the second clock gate 1120 is delayed by one clock period relative to the gate-enable signal 1125 input to the first clock gate 1115, the ZQ pulse is delayed by one clock period relative to the Q pulse.

As discussed above, the counter 1110 outputs a gate-enable signal 1125 during every Nth period (cycle) of the reference clock. To do this, the counter 1110 may count the number of periods of the reference clock, and output the gate-enable signal each time the counter 1110 counts N periods of the reference clock. Since the value of N is programmable, the rate at which the counter 1010 enables the clock gates 1115 and 1120 to produce a pulse pair (and hence the rate at which the master delay circuit 710 updates the voltage bias) is programmable.

Each of the clock gates 1115 and 1120 may be implemented using one or more logic gates. For example, each clock gate 1115 and 1120 may comprise an AND gate having first and second inputs. The first input of the AND gate receives the reference clock and the second input of the AND gate receives either a gate-enable signal (logic one) or a gate-disable signal (logic zero). In this example, the AND gate passes the reference clock when the AND gate receives a gate-enable signal (logic one), and blocks the reference clock when the AND gate receives a gate-disable signal (logic zero). When the reference clock is blocked, the AND gate outputs a logic zero. The clock gates 1115 and 1120 according to this embodiment may be used to generate high pulse pairs (examples of which are shown in FIGS. 8 and 9).

In another example, each clock gate 1115 and 1120 may comprise an OR gate having first and second inputs. The first input of the OR gate receives the reference clock and the second input of the OR gate receives either a gate-enable signal (logic zero) or a gate-disable signal (logic one). In this example, the OR gate passes the reference clock when the OR gate receives a gate-enable signal (logic zero), and blocks the reference clock when the OR gate receives a gate-disable signal (logic one). When the reference clock is blocked, the OR gate outputs a logic one. The clock gates 1115 and 1120 according to this embodiment may be used to generate low pulse pairs (an example of which is shown in FIG. 10).

It is to be appreciated that the clock gates 1115 and 1120 are not limited to the examples discussed above, and that each clock gate 1115 and 1120 may be implemented using other types of logic gates and/or a combination of logic gates.

The clock period delay circuit 1122 may be implemented with a flip-flip (e.g., D flip-flop) that receives the reference clock and the gate-enable signal, and delays the gate-enable signal by one period of the received reference clock.

As discussed above, the update controller 750 may adjust the value of N based on the timing requirements of the memory interface. For example, the timing requirements may depend on the data rate of the memory interface at a given time. When the data rate is reduced, the timing requirements of the memory interface become more relaxed, and hence the performance requirements for the master delay circuit are reduced. In this case, the rate at which the voltage bias is updated may be reduced (i.e., N may be increased) to reduce power consumption. When the data rate is increased, the timing requirements of the memory interface become tighter (e.g., the amount of jitter that can be tolerated by flip-flops for proper data sampling is reduced). In this case, the rate at which the voltage bias is updated may be increased (i.e., N may be reduced) to increase performance.

In one embodiment, the update controller 750 may include a lookup table, in which the lookup table comprises a plurality of different data rates supported by the memory interface. The lookup table may map each data rate to a corresponding value of N. The value of N may be larger for lower data rates. In this embodiment, the update controller 750 may receive an indication of the current data rate of the memory interface (e.g., from a memory controller), and determine a value of N corresponding to the current data rate using the lookup table. The update controller 750 may then program the update circuit 712 in the master delay circuit 710 with the determined value of N.

If the data rate changes, then the update controller 750 may determine a value of N corresponding to the new data rate using the lookup table. If the value of N for the new data rate is different from the value of N for the previous data rate, then the update controller 750 may program the update circuit 712 in the master delay circuit 710 with the value of N for the new data rate. Thus, the value of N (and hence the rate of voltage bias updates) may be adjusted according to changes in the data rate of the memory interface.

For example, for a DDR memory interface, N may be set to a maximum value (e.g., 32) when the data rate is below a first data rate (e.g., below 400 MHz), and N may be set to one when the data rate is above a second data rate (e.g., above 1.6 GHz). In this example, N may be adjusted to a value between one and the maximum value for data rates between the first and second data rates (e.g., between 400 MHz and 1.6 GHz).

When the master delay circuit 710 is first powered on, the phase error may be relatively large. In this regard, the update controller 750 may initially set the value of N to one to quickly reduce the phase error and lock the loop of the master delay circuit 710. When the phase error drops to an acceptable level, the update controller 750 may increase the value of N to reduce power consumption. For example, the update controller 750 may increase the value of N based on the current data rate of the memory interface, as discussed above.

Figure 12:
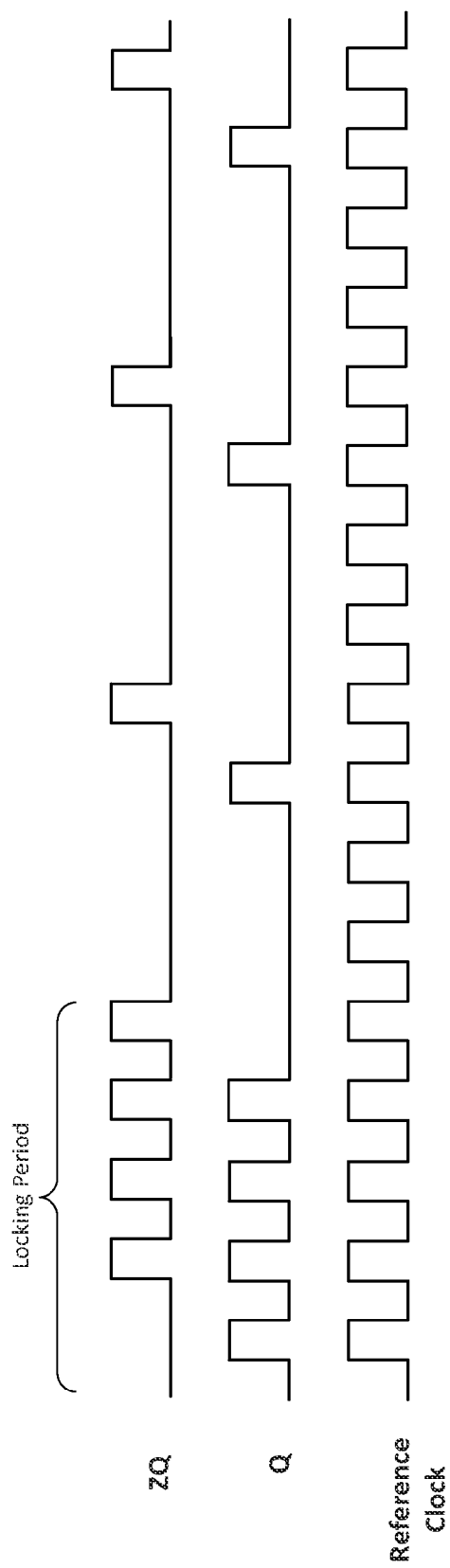
FIG. 12 is a timing diagram illustrating an example of loop locking according to an embodiment of the present disclosure.

FIG. 12 is a timing diagram showing an example in which the value of N is initially set to one during a locking period. During the locking period, the voltage bias is updated every period of the reference clock to quickly lock the loop of the master delay circuit 710. The locking period may end when the phase error drops to an acceptable level (e.g., a level that meets timing requirements of the memory interface). After the loop of the master delay circuit 710 is locked, the value of N may be increased to reduce power. In the example shown in FIG. 12, the value of N is increased to four. However, it is to be appreciated that embodiments of the present disclosure are not limited to this example, and that the value of N may be increased to any value that meets timing requirements of the memory interface. It is also to be appreciated that the locking period is not limited to the duration in the example shown in FIG. 12. In general, the duration of the locking period may depend on the number of voltage bias updates needed to reduce the phase error to an acceptable level.

In one embodiment, the update controller 750 may end the locking period after a predetermined number of clock periods from the start of the locking period. In this embodiment, the predetermined number of clock periods may be based on an estimate of the number of clock periods needed to lock the master delay circuit 710. In another embodiment, the update controller 750 may monitor the detected phase error from the PFD 520. In this embodiment, the update controller 750 may end the locking period when the detected phase error drops below a threshold.

Figure 13:
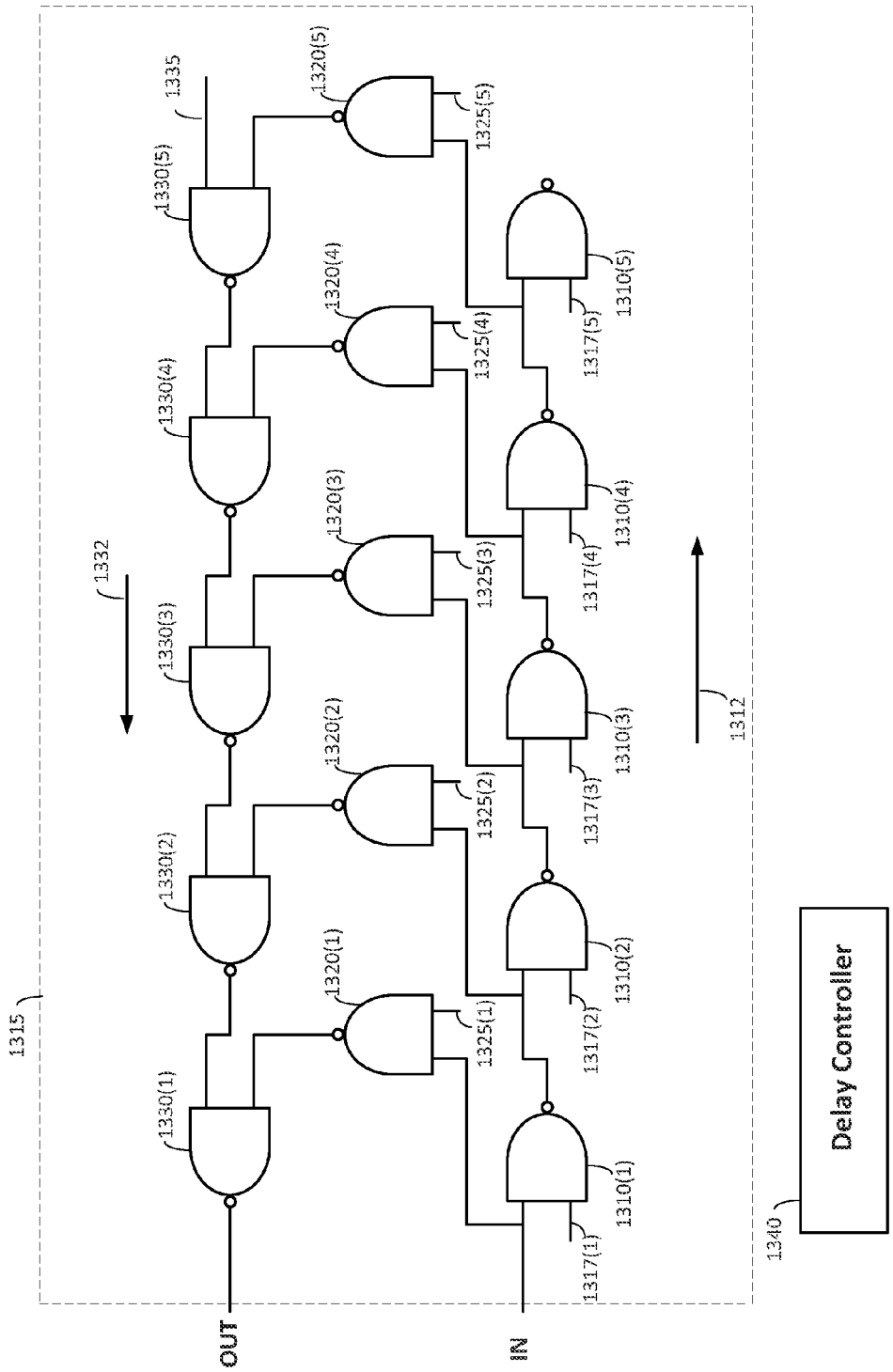
FIG. 13 shows an exemplary implementation of a slave delay circuit according to another embodiment of the present disclosure.

FIG. 13 shows an exemplary implementation of a slave delay circuit 1315 according to an embodiment of the present disclosure. The slave delay circuit 1315 may be used to implement any one of the slave delay circuits 315(1)-315(m) shown in FIG. 3. The slave delay circuit 1315 comprises a first plurality of NAND gates 1310(1)-1310(5) along a forward path (indicated by arrow 1312), and a second plurality of NAND gates 1330(1)-1330(5) along a return path (indicated by arrow 1332). The slave delay circuit 1315 also comprises a third plurality of NAND gates 1320(1)-1320(5) between the forward and return paths, where each NAND gate 1320(1)-1320(5) is coupled between two different positions on the forward and return paths. The NAND gates 1310(1)-1310(5), 1320(1)-1320(5) and 1330(1)-1330(5) are biased by the voltage bias (not shown in FIG. 13) from the master delay circuit, in which the voltage bias controls the delay of each NAND gate.

In this embodiment, a delay controller 1340 controls the delay between the input and output (denoted "IN" and "OUT") of the slave delay circuit 1315. The delay controller 1340 does this by selectively enabling and disabling NAND gates in the slave delay circuit 1315 to control the path of a signal through the slave delay circuit 1315, as discussed further below.

In this regard, NAND gates 1310(1)-1310(5) receive control signals at control inputs 1317(1)-1317(5) from the delay controller 1340, NAND gates 1320(1)-1320(5) receive control signals at control inputs 1325(1)-1325(5) from the delay controller 1340, and NAND gate 1330(5) receives a control signal at control input 1335 from the delay controller 1340. For ease of illustration, the connections between the control inputs of the NAND gates and the delay controller 1340 are not shown in FIG. 13. The control signals selectively enable and disable the NAND gates to control the path of a signal through the slave delay circuit 1315, and hence control the delay of the signal through the slave delay circuit 1315. When a NAND gate is enabled (e.g., by inputting a logic one to the respective control input), the NAND gate acts as an inverter. When a NAND gate is disabled (e.g., by inputting a logic zero to the respective control input), the output state of the NAND gate is constant.

Figure 14A:
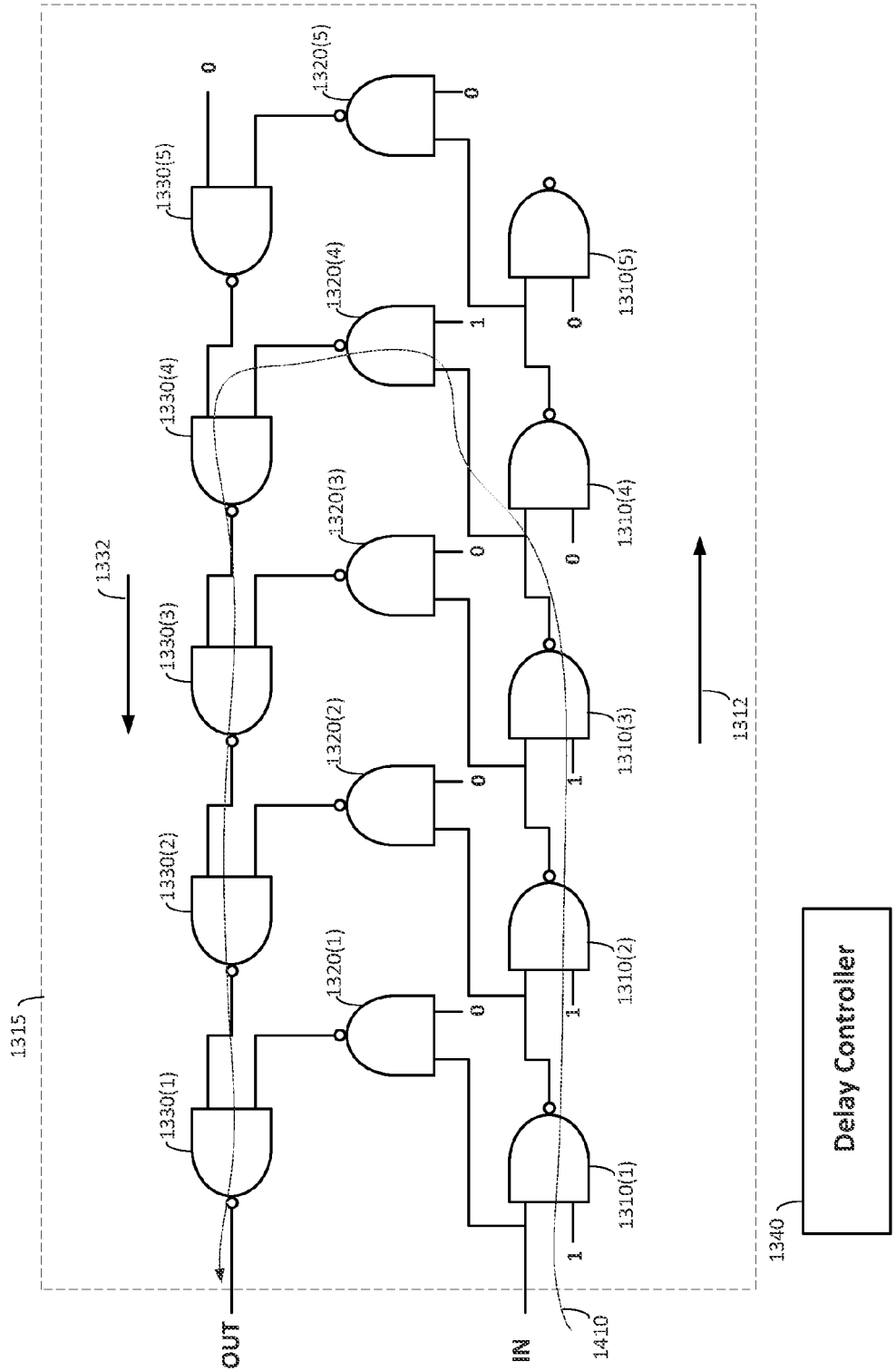
FIGS. 14A and 14B show examples of different delay paths through the slave delay circuit of FIG. 13.

FIG. 14A shows an example in which the delay controller 1340 forms a delay path 1410 through NAND gates 1310(1)-1310(3), 1320(4) and 1330(1)-1330(4) of the slave delay circuit 1315. In this example, the delay through the slave delay circuit 1315 equals eight times the delay of one NAND gate since the signal propagates through eight NAND gates. FIG. 14A also shows the logic states of the control signals input to the control inputs of NAND gates 1310(1)-1310(5), 1320(1)-1320(5) and 1330(5) from the delay controller 1340 to form the delay path 1410. For ease of illustration, the reference numbers of the control inputs are not shown in FIG. 14A.

Figure 14B:
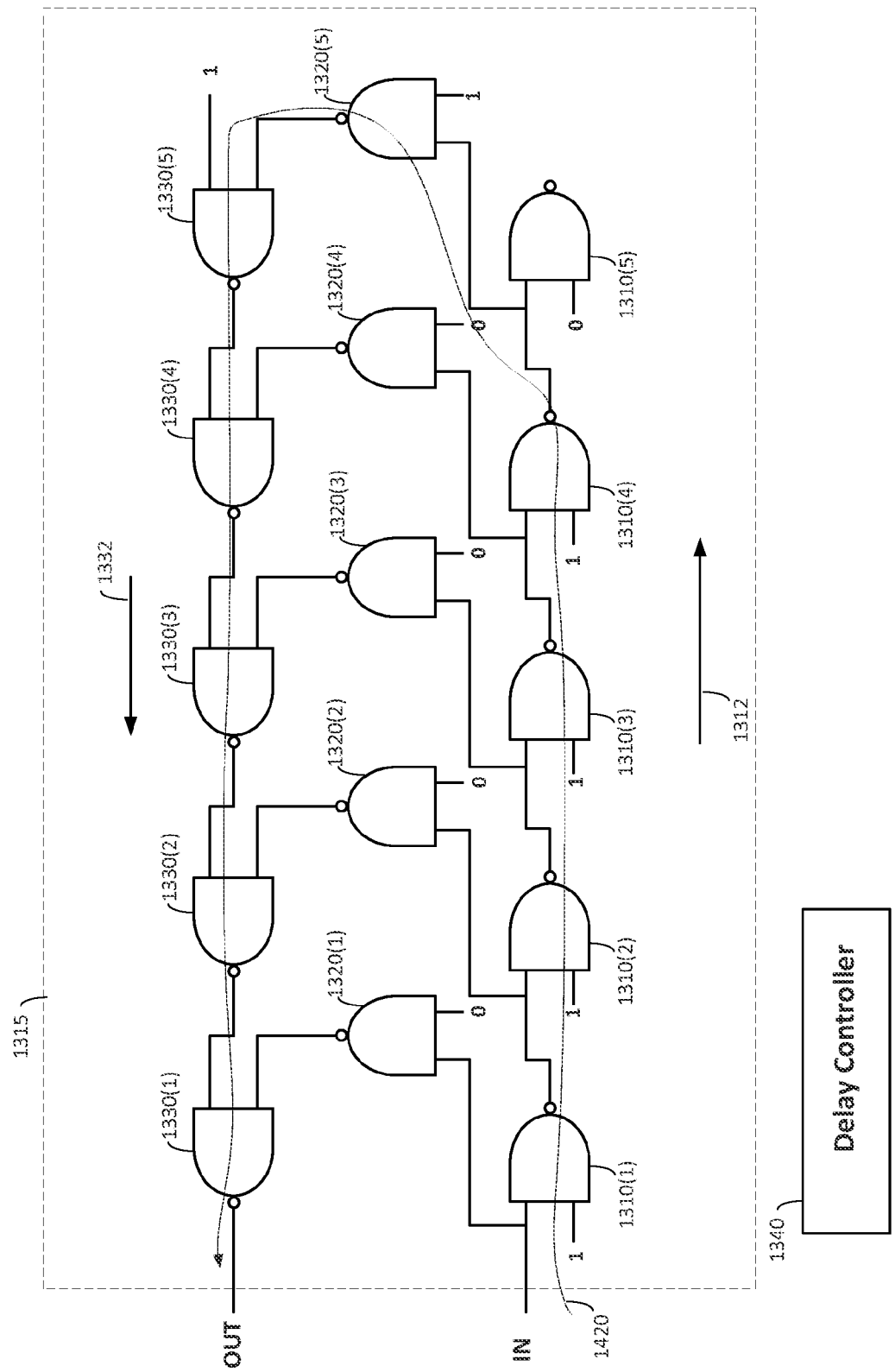

FIG. 14B shows an example in which the delay controller 1340 forms a delay path 1420 through NAND gates 1310(1)-1310(4), 1320(5) and 1330(1)-1330(5) of the slave delay circuit 1315. In this example, the delay through the slave delay circuit 1315 equals ten times the delay of one NAND gate since the signal propagates through ten NAND gates. FIG. 14B also shows the logic states of the control signals input to the control inputs of NAND gates 1310(1)-1310(5), 1320(1)-1320(5) and 1330(5) from the delay controller 1340 to form the delay path 1420. For ease of illustration, the reference numbers of the control inputs are not shown in FIG. 14B.

In this embodiment, the delay controller 1340 is capable of adjusting the delay of the slave delay circuit 1315 by multiples of a step delay, where the step delay is the delay of two NAND gates. A step delay of two NAND gates ensures that a signal has the same polarity at the input and output of the salve delay circuit 1315. The step delay is controlled by the voltage bias supplied to the NAND gates from the master delay circuit. It is to be appreciated that the slave delay circuit 1315 is not limited to the number of NAND gates in the example shown in FIG. 13, and that the slave delay circuit 1315 may include any number of NAND gates. For example, the number of NAND gates may be increased to increase the number of selectable delays.

Figure 15:
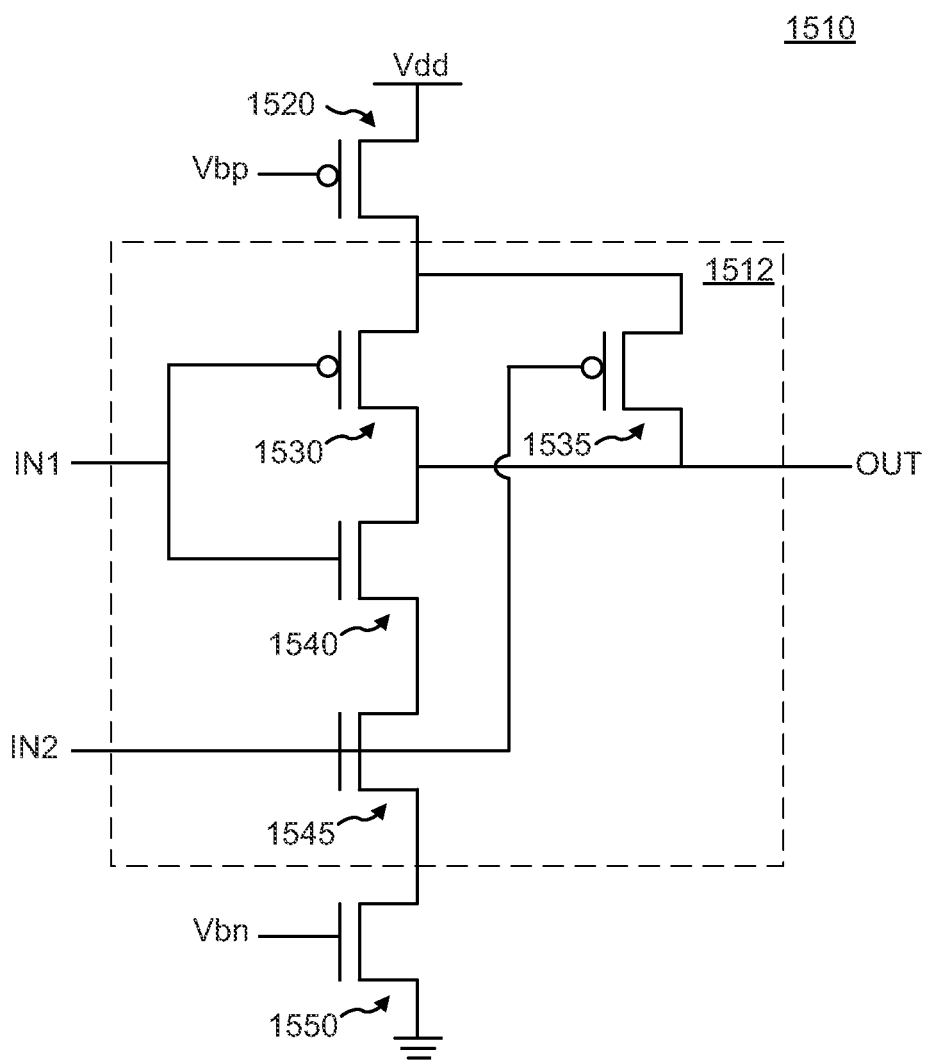
FIG. 15 shows an exemplary implementation of a NAND gate with voltage-controlled delay according to an embodiment of the present disclosure.

FIG. 15 shows an exemplary implementation of a NAND gate 1510 with voltage-controlled delay according to an embodiment of the present disclosure. The NAND gate 1510 may be used to implement the NAND gates in FIG. 13. The NAND gate 1510 comprises NAND logic 1512, a current-starving PMOS transistor 1520, and a current-starving NMOS transistor 1550. As discussed further below, the NAND logic 1512 performs the logic functions of the NAND gate 1510, and the PMOS and NMOS transistors 1520 and 1550 control the delay of the NAND gate 1510.

The NAND logic 1512 comprises a first PMOS transistor 1530, a second PMOS transistor 1535, a first NMOS 1540 transistor, and a second NMOS transistor 1545. The sources of the first and second PMOS transistors 1530 and 1535 are coupled together, the drains of the first and second PMOS transistors 1530 and 1535 are coupled together, the drain of the first NMOS transistor 1540 is coupled to the drains of the first and second PMOS transistors 1530 and 1535, and the source of the first NMOS transistor 1540 is coupled to the drain of the second NMOS transistor 1545. The sources of the first and second PMOS transistors 1530 and 1535 are coupled to a power-supply Vdd through the current-starving PMOS transistor 1520, and the source of the second NMOS transistor 1545 is coupled to ground through the current-starving NMOS transistor 1550.

A first input (denoted "IN1") of the NAND gate 1510 is coupled to the gates of the first PMOS transistor 1530 and the first NMOS transistor 1540, and a second input (denoted "IN2") of the NAND gate 1510 is coupled to the gates of the second PMOS transistor 1535 and the second NMOS transistor 1545. The output (denoted "OUT") of the NAND gate 1510 is coupled to the drains of the first PMOS transistor 1530, the second PMOS transistor 1535, and the first NMOS transistor 1540.

As discussed above, the NAND logic 1512 performs the logic functions of the NAND gate 1510. In this regard, the NAND logic 1512 outputs a logic zero if both the first and second inputs (IN1 and IN2) are at logic one, and outputs a logic one otherwise. Thus, if the second input (IN2) is at logic zero, then the NAND logic 1512 outputs a logic one regardless of the logic state at the first input (IN1). If the second input (IN2) is at logic one, then the NAND logic 1512 outputs the inverse of the logic state at the first input (IN1).

In one example, the first input (IN1) may be used to receive a signal propagating through a slave delay circuit (e.g., slave delay circuit 1315), and the second input (IN2) may be used to receive a control signal from a delay controller (e.g., delay controller 1340). In this example, if the control signal is logic zero, then the NAND logic 1512 outputs a logic one regardless of the logic state at the first input (IN1). In this case, the NAND logic 1512 does not propagate the signal at the first input (IN1). If the control signal is logic one, then the NAND logic 1512 inverts the signal at the first input (IN1), and therefore propagates the signal as an inverter.

As discussed above, the current-starving PMOS transistor 1520 and the current-starving NMOS transistor 1550 control the delay of the NAND gate 1510. More particularly, the current-starving NMOS transistor 1550 receives a first voltage bias Vbn at its gate, and controls the delay of a signal that causes a falling edge at the output of the NAND gate 1510 based on the first voltage bias Vbn. This is because the first voltage bias Vbn controls the conductivity of the current-starving NMOS transistor 1550, and therefore the amount of current that can flow from the output (OUT) of the NAND gate 1510 to ground through the current-starving NMOS transistor 1550. This, in turn, controls the fall time of the NAND gate 1510 and therefore the amount of time for the output (OUT) of the NAND gate 1510 to transition from high to low (i.e., falling edge). The higher the first voltage bias Vbn, the higher the current from the output (OUT) to ground, and therefore the shorter the delay. The lower the first voltage bias Vbn, the lower the current from the output (OUT) to ground, and therefore the longer the delay.

The current-starving PMOS transistor 1520 receives a second voltage bias Vbp at its gate, and controls the delay of a signal that causes a rising edge at the output (OUT) of the NAND gate 1510 based on the second voltage bias Vbp. This is because the second voltage bias Vbp controls the conductivity of the current-starving PMOS transistor 1520, and therefore the amount of current that can flow from Vdd to the output (OUT) of the NAND gate 1510 through the current-starving PMOS transistor 1520. This, in turn, controls the rise time of the NAND gate 1510, and therefore the amount of time for the output of the NAND gate 1510 to transition from low to high (i.e., rising edge). The lower the second voltage bias Vbp, the higher the current from Vdd to the output (OUT), and therefore the shorter the delay. The higher the second voltage bias Vbp, the lower the current from Vdd to the output (OUT), and therefore the longer the delay.

Thus, the first and second voltage biases Vbn and Vbp control the delay of the NAND gate 1510, and therefore control the step delay of a slave delay circuit comprising NAND gates implemented with the NAND gate 1510. The first voltage bias Vbn controls the delay of a falling edge at the output (OUT) of the NAND gate 1510, and the second voltage bias Vbp controls the delay of a rising edge at the output (OUT) of the NAND gate 1510.

Figure 16:
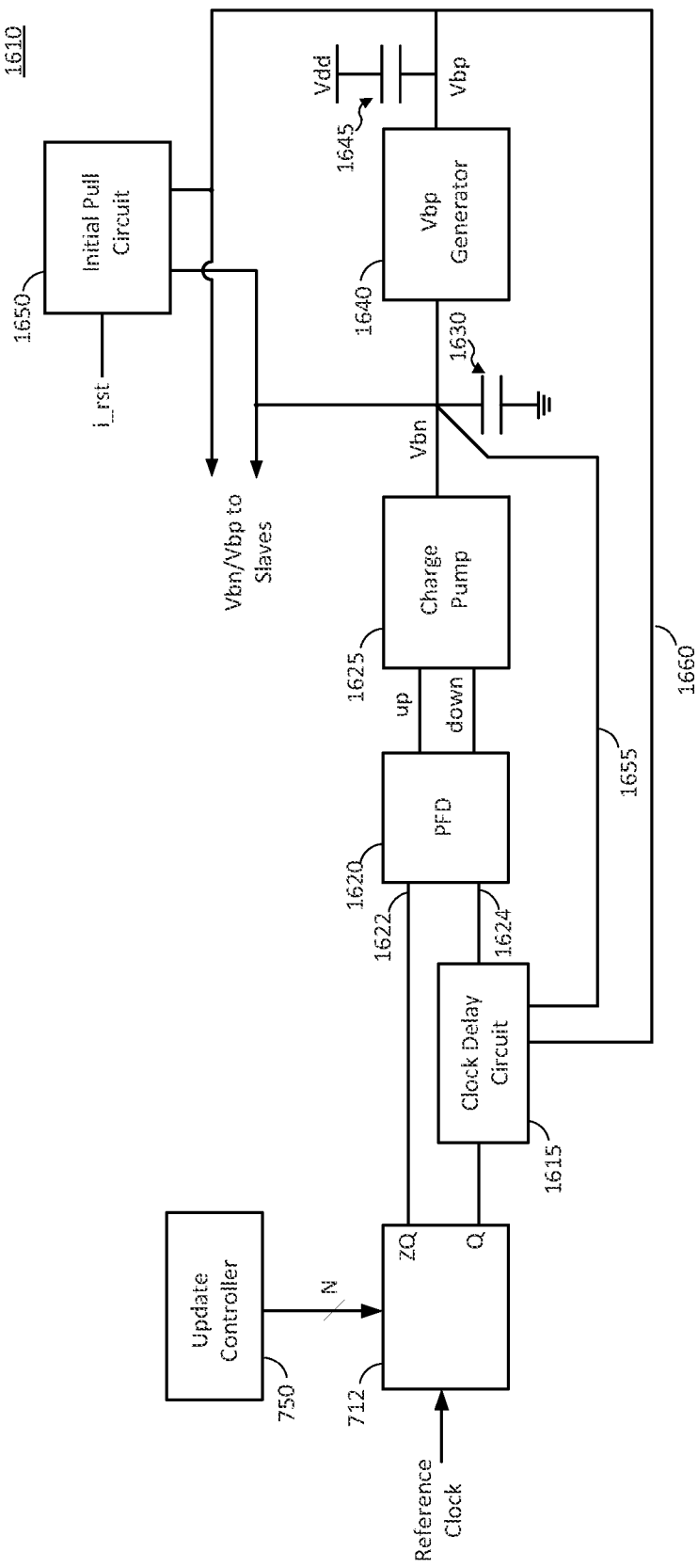
FIG. 16 shows an exemplary implementation of a master delay circuit according to another embodiment of the present disclosure.

FIG. 16 shows a master delay circuit 1610 configured to adjust the first and second voltage biases Vbn and Vbp to achieve a desired step delay for the slave delay circuits according to an embodiment of the present disclosure. The master delay circuit 1610 comprises the update circuit 712, a clock delay circuit 1615, a phase frequency detector (PFD) 1620, a charge pump 1625, a Vbp generator 1640, and an initial pull circuit 1650. The master delay circuit 1610 further comprises a first capacitor 1630 coupled between the output of the charge pump 1625 and ground, and a second capacitor 1645 coupled between Vdd and the output of the Vbp generator 1640. As discussed further below, the first capacitor 1630 is used to generate the first voltage bias Vbn, and the second capacitor 1645 is used to generate the second voltage bias Vbp.

In operation, the update circuit 712 outputs a pair of pulses every N periods (cycles) of the reference clock. Each pair of pulses comprises a Q pulse and a ZQ pulse, in which the ZQ pulse is delayed by approximately one clock period relative to the Q pulse. For each pair of pulses, the update circuit 712 outputs the ZQ pulse to the first input 1622 of the PFD 1620 and outputs the Q pulse to the clock delay circuit 1615. The clock delay circuit 1615 delays the Q pulse by an amount controlled by the first and second voltage biases Vbn and Vbp, which are fed back to the clock delay circuit 1615 from the outputs of the charge pump 1625 and the Vbp generator 1640, respectively. The first voltage bias Vbn is fed back to the clock delay circuit 1615 by a first feedback loop 1655, and the second voltage bias Vbp is fed back to the clock delay circuit 1615 by a second feedback loop 1660. The clock delay circuit 1615 outputs the resulting delayed Q pulse to the second input 1624 of the PFD 1620.

The PFD 1620 detects a phase error between the ZQ pulse and the delayed Q pulse. For example, the PFD 1620 may detect the phase error by detecting the phase difference between the rising edges of the ZQ pulse and the delayed Q pulse or the phase difference between the falling edges of the ZQ pulse and the delayed Q pulse. The PFD 1620 outputs an UP signal and/or a DOWN signal to the charge pump 1625 based on the detected phase error. The UP signal causes the charge pump 1625 to charge the first capacitor 1630 (and hence increase the first voltage bias Vbn), and the DOWN signal causes the charge pump 1625 to discharge the first capacitor 1630 (and hence decrease the first voltage bias Vbn). The PFD 1620 adjusts the UP signal and/or DOWN signal (and hence the first voltage bias Vbn) in a direction that decreases the detected phase error.

The first voltage bias Vbn is input to the Vbp generator 1640, which generates the second voltage bias Vbp based on the first voltage bias Vbn. In one embodiment, the Vbp generator 1640 may simply adjust the second voltage bias Vbp such that Vdd-Vbp is approximately equal to Vbn. In another embodiment, the Vbp generator 1640 may adjust the second voltage bias Vbp such that the rise times and the fall times of NAND gates in the slave delay circuits are approximately equal. For example, the Vbp generator 1640 may comprise two NAND gates driven by complementary signals, causing one of the NAND gates to rise while the other NAND gate falls. Both NAND gates may be biased by the first and second voltage biases Vbn and Vbp and may be replicas of NAND gates in the slave delay circuits. In this example, the Vbp generator 1640 may detect the point (e.g., voltage) where the rising and falling edges of the NAND gates cross, and adjust the second voltage bias Vbp so that the crossing point is approximately in the middle of the voltage swing of the NAND gates (e.g., approximately half Vdd).

The phase error approaches zero when the delay of the clock delay circuit 1615 is approximately equal to one period of the reference clock. Thus, the master delay circuit 1610 adjusts the first and second voltage biases Vbn and Vbp such that the delay of the clock delay circuit 1615 is approximately equal to one clock period. In one embodiment, the clock delay circuit 1615 has a delay that is approximately equal to a multiple M of the step delay of the slave delay circuits. For example, in a simple implementation, the clock delay circuit 1615 may comprise 2*M NAND gates coupled in series, where the step delay is the delay of two NAND gates. Thus, in this embodiment, the master delay circuit 1610 updates the first and second voltage biases Vbn and Vbp every N clock periods (cycles) to maintain a step delay of approximately T/M, where T is one clock period (cycle).

The first capacitor 1630 holds the first voltage bias Vbn between updates, and the second capacitor 1645 holds the second voltage bias Vbp between updates. The first and second voltage biases Vbn and Vbp drift between updates. As discussed above, increasing the time between updates (i.e., increasing N) reduces power consumption at the expense of more drift between updates (and hence lower performance). In this regard, the update controller 750 may adjust the rate of updates (i.e., adjust N) to reduce power consumption while still meeting timing requirements for a particular data rate.

The initial pull circuit 1650 is configured to set the initial values for the first and second voltage biases Vbn and Vbp to prevent a false lock. To do this, the initial pull circuit 1650 initially pulls up the first voltage bias Vbn to the power supply Vdd and pulls down the second voltage bias Vbp to ground when a reset signal (denoted "i_rst") is asserted (e.g., i_rst is logic one). This initially sets the clock delay circuit 1615 to a delay that is shorter than one clock period, which helps ensure that the master delay circuit 1610 locks the delay of the clock delay circuit 1615 to one clock period.

After the first and second voltage biases Vbn and Vbp are initially set and reset is turned off (e.g., i_rst is logic zero), the master delay circuit 1610 may update the first and second voltage biases Vbn and Vbp every clock period (cycle) during a locking period. Once the master delay circuit 1610 is locked, the space between updates may be increased (i.e., N may be increased) to conserve power, as discussed above.

Figure 17:
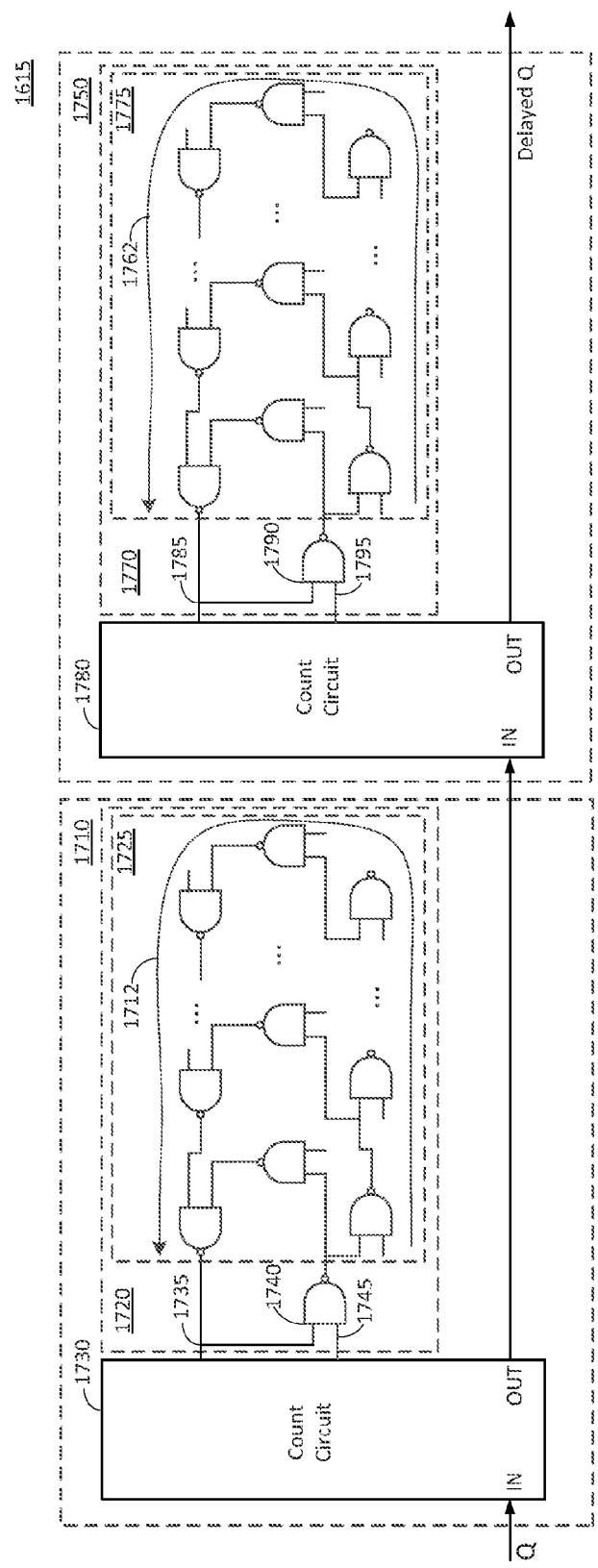
FIG. 17 shows an exemplary implementation of a clock delay circuit according to another embodiment of the present disclosure.

FIG. 17 shows an exemplary implementation of the clock delay circuit 1615 according to an embodiment of the present disclosure. The clock delay circuit 1615 comprises a first delay stage 1710 and a second delay stage 1750. The total delay through the clock delay circuit 1615 is approximately the sum of the delays through the first and second delay stages 1710 and 1750.

The first delay stage 1710 comprises an oscillator 1720, and a count circuit 1730. The oscillator 1720 comprises a delay circuit 1725, and an oscillation enable/disable circuit 1740.

The delay circuit 1725 may comprise NAND gates coupled in a structure similar to the structure of the slave delay circuit 1315 in FIG. 13. In the example shown in FIG. 17, a portion of the NAND gates in the delay circuit 1725 are enabled to form a delay path 1712 through the delay circuit 1725. In one example, the delay of the path 1712 is equal to 16*td, where td is one step delay (e.g., delay of two NAND gates). The step delay td is controlled by the first and second voltages biases Vbn and Vbp (not shown in FIG. 17).

The oscillation enable/disable circuit 1740 controls whether the oscillator 1720 is enabled or disabled based on a control signal from the count circuit 1730, as discussed further below. In the example in FIG. 17, the oscillation enable/disable circuit 1740 comprises a NAND gate 1740 having a first input coupled to the output 1735 of the delay circuit 1725, a second input 1745 (also referred to as a control input) coupled to the count circuit 1730 for receiving the control signal, and an output coupled to the input of the delay circuit 1725. The NAND gate 1740 may be biased by the first and second voltages biases Vbn and Vbp (not shown in FIG. 17).

In this example, when the control signal is logic one, the NAND gate 1740 acts as an inverter between the output and input of the delay circuit 1725, causing the delay circuit 1725 to oscillate. Thus, the oscillator 1720 is enabled when the control signal is logic one. When the control signal is logic zero, the output state of the NAND gate 1740 is held constant at logic one regardless of the logic state at the output of the delay circuit 1725. This effectively blocks the output of the delay circuit 1725 from the input of the delay circuit 1725. As a result, the delay circuit 1725 is prevented from oscillating. Thus, the oscillator 1720 is disabled when the control signal is logic zero.

When the oscillator 1720 is enabled, the delay circuit 1725 and the NAND gate 1740 form a closed loop in which one trip through the loop is equal to the sum of the delay of the path 1712 through the delay circuit 1725 and the delay of the NAND gate 1740. For the example where the delay of the path 1712 equals 16*td, one trip through the loop approximately equals 16.5*td (i.e., 16*td delay through the path 1712 and 0.5*td delay through the NAND gate 1740).

Exemplary operations of the first delay stage 1710 will now be described according to embodiments of the present disclosure. In this example, it may be assumed that the first delay stage 1710 receives low Q pulses from the update circuit 712 (an example of which is shown in FIG. 10). Prior to receiving a rising edge of a Q pulse from the update circuit 712, the oscillator 1720 is disabled (i.e., the count circuit 1730 outputs a logic zero to the control input 1745 of the NAND gate 1740). In addition, the count circuit 1730 outputs a logic one to the second delay stage 1750.

On the rising edge of the Q pulse, the count circuit 1730 is triggered. This causes the count circuit 1730 to output a logic one to the control input 1745 of the NAND gate 1740 to enable the oscillator 1720. This also causes the count circuit 1730 to begin counting a number of oscillations of the oscillator 1720, and to transition the output to the second delay stage 1750 from high to low.

As the oscillator 1720 oscillates, the logic state at the output 1735 of the delay circuit 1725 changes. The time between changes in the output logic state is approximately equal to the delay of one trip through the NAND gate 1740 and the path 1712 in the delay circuit 1725. The count circuit 1730 may increment a count value on each falling edge at the output 1735 of the delay circuit 1725. Alternatively, the count circuit 1730 may increment the count value on each rising edge at the output 1735 of the delay circuit 1725. In either case, the count circuit 1730 increments the count value each time a signal makes two trips through the NAND gate 1740 and the path 1712 in the delay circuit 1725. For the example in which the delay through the NAND gate 1740 and the path 1712 in the delay circuit 1725 equals 16.5*td, the count circuit 1730 increments the count value after a delay of 2*16.5*td.

When the count value reaches a predetermined terminal count value (e.g., 13 counts), the count circuit 1730 outputs a logic zero to the control input 1745 of the NAND gate 1740 to disable the oscillator 1720. The count circuit 1730 also outputs a rising edge to the second delay stage 1750. Thus, the first delay stage 1710 outputs a rising edge to the second delay stage 1750 in response to the count value reaching the terminal count value. For the example where the terminal count value is 13 and the delay through the NAND gate 1740 and the delay circuit 1725 is 16.5*td, the delay between the rising edge of the Q pulse input to the first delay stage 1710 and the rising edge output to the second delay stage 1750 is approximately equal to 13*2*16.5*td. After the terminal count is reached, the oscillator 1720 may remain disabled until the count circuit 1730 is re-triggered by the rising edge of the next Q pulse. In addition, the count circuit 1730 may output a logic one to the second stage 1750 until re-triggered.

In one embodiment, the second delay stage 1750 has substantially the same structure as the first delay stage 1710. In this embodiment, the second delay stage 1750 comprises an oscillator 1770, and a count circuit 1780. The oscillator 1770 comprises an oscillation enable/disable circuit 1790 and a delay circuit 1775. In the example in FIG. 17, the oscillation enable/disable circuit 1790 comprises a NAND gate 1790. The delay circuit 1775, the count circuit 1780, and the NAND gate 1790 in the second delay stage 1750 may function in a substantially similar manner as the delay circuit 1725, the count circuit 1730, and the NAND gate 1740 in the first delay stage 1710.

Prior to receiving the rising edge from the first delay stage 1710, the oscillator 1770 in the second delay stage 1750 is disabled (i.e., the count circuit 1780 outputs a logic zero to the control input 1795 of the NAND gate 1790). Also, the count circuit 1780 outputs a logic one to the PFD 1620.

On the rising edge from the first delay stage 1710, the count circuit 1780 is triggered. This causes the count circuit 1780 to output a logic one to the control input 1795 of the NAND gate 1790 to enable the oscillator 1770. This also causes the count circuit 1780 to begin counting a number of oscillations of the oscillator 1770, and to transition the output to the PFD 1620 from high to low.

When the count value at the count circuit 1780 reaches a predetermined terminal count value (e.g., 13 counts), the count circuit 1780 outputs a logic zero to the NAND gate 1790 to disable the oscillator 1770. The count circuit 1780 also outputs a rising edge to the PFD 1620. For the example in which the terminal count value is 13 and the delay through the NAND gate 1790 and the delay circuit 1775 is 16.5*td, the delay between the rising edge input to the second delay stage 1750 and the rising edge output to the PFD 1620 is approximately equal to 13*2*16.5*td. After the terminal count is reached, the oscillator 1770 may remain disabled until the count circuit 1780 is re-triggered by the next rising edge from the first delay stage 1710. In addition, the count 1780 may output a logic one to the PFD 1620 until re-triggered.

Figure 18:
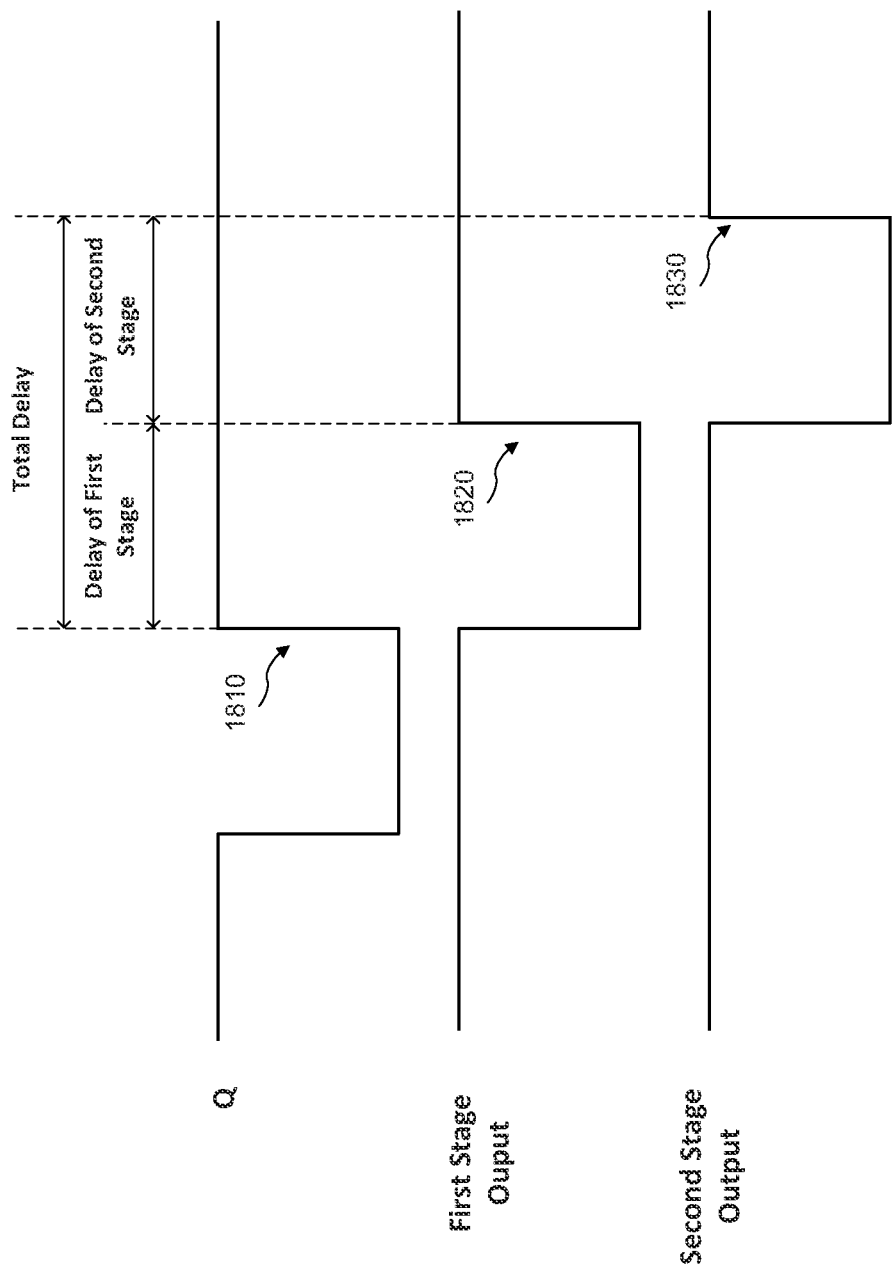
FIG. 18 is a timing diagram illustrating outputs of a first delay stage and a second delay stage of the clock delay circuit according to an embodiment of the present disclosure.

FIG. 18 is a timing diagram illustrating an example of the Q pulse, the output of the first delay stage 1710, and the output of the second delay stage 1750. In this example, it is assumed that N is greater than one. The rising edge 1810 of the Q pulse triggers the count circuit 1730 in the first delay stage 1710, causing the output of the first delay stage 1710 to transition from high to low. When the count value of the count circuit 1730 reaches the terminal count, the first delay stage 1710 outputs a rising edge 1820 to the second delay stage 1750. The rising edge 1820 from the first delay stage 1710 triggers the count circuit 1780 in the second delay stage, causing the output of the second delay stage 1750 to transition from high to low. When the count value of the count circuit 1780 reaches the terminal count, the second delay stage 1750 outputs a rising edge 1830 to the PFD 1620. The rising edge 1830 output to the PFD 1620 is delayed from the rising edge of the Q pulse by the sum of the delays through the first and second delay stages 1710 and 1750, as shown in FIG. 18.

As discussed above, the master delay circuit 1610 adjusts the first and second voltage biases Vbn and Vbp until the delay through the clock delay circuit 1615 is approximately equal to one clock period. Thus, the master delay circuit 1610 adjusts the first and second voltage biases Vbn and Vbp to achieve a step delay of T/M, where T is one clock period and M is the total number of step delays in the first and second delay stages 1710 and 1750. For the example in which the delay through each stage 1710 and 1750 of the clock delay circuit 1615 equals 13*2*16.5*td, the total delay through the clock delay circuit 1615 is 2*13*2*16.5*td. In this example, the master delay circuit 1610 adjusts the first and second biases Vbn and Vbp to achieve a step delay td approximately equal to T/(2*13*2*16.5), where T is one clock period.

The exemplary clock delay circuit 1615 in FIG. 17 offers one or more of the following advantages. First, the clock delay circuit 1615 is able to achieve a small step delay using a much smaller number of NAND gates compared with simply using a long delay chain, thereby reducing the size of the clock delay circuit 1615. This is because the clock delay circuit 1615 uses a relatively small delay chain (e.g., the NAND gates in path 1712) to form an oscillator, and counts a number of oscillations of the oscillator to create the delay of the clock delay circuit 1615.

Another advantage is that the power consumption of the clock delay circuit 1615 is substantial reduced when the rate of voltage bias updates is reduced (i.e., N is increased). This is because the oscillators 1720 and 1770 are disabled between updates. As a result, when the space between updates is increased (i.e., N is increased), the dynamic power consumption from the oscillators 1720 and 1770 is reduced. For example, when N is greater than one, the power consumed by the oscillators 1720 and 1770 is reduced to approximately 1/N the power consumed by the oscillators 1720 and 1770 for the case where the voltage biases Vbn and Vbp are updated every clock period.

Another advantage is that using two delay stages 1710 and 1750 provides each stage with more time to reset between Q pulses. For example, when the first delay stage 1710 reaches the terminal count for a current Q pulse and N equals one, the first delay stage 1710 has an amount of time approximately equal to the delay of the second delay stage 1750 to reset for the next Q pulse.

It is to be appreciated that the delay circuits 1725 and 1775 are not limited to NAND gates. For example, each delay circuit 1725 and 1775 may comprise a chain of delay elements other than NAND gates, in which the delay elements may be replicas of delay elements in the slave delay circuits. In this example, the input and output of the delay chain may be selectively coupled to form an oscillator, and the respective count circuit 1730 and 1780 may count a number of oscillations of the oscillator to create a delay.

It is also to be appreciated that the clock delay circuit 1615 is not limited to two delay stages. For example, the clock delay circuit 1615 may comprise one delay stage 1710 in which the output of the first delay stage 1710 provides the delayed Q pulse to the PFD 1620. One delay stage 1710 may be used, for example, when the delay stage 1710 has adequate time to reset for the next Q pulse without the need for a second delay stage (e.g., when N is equal to two or more).

Figure 19:
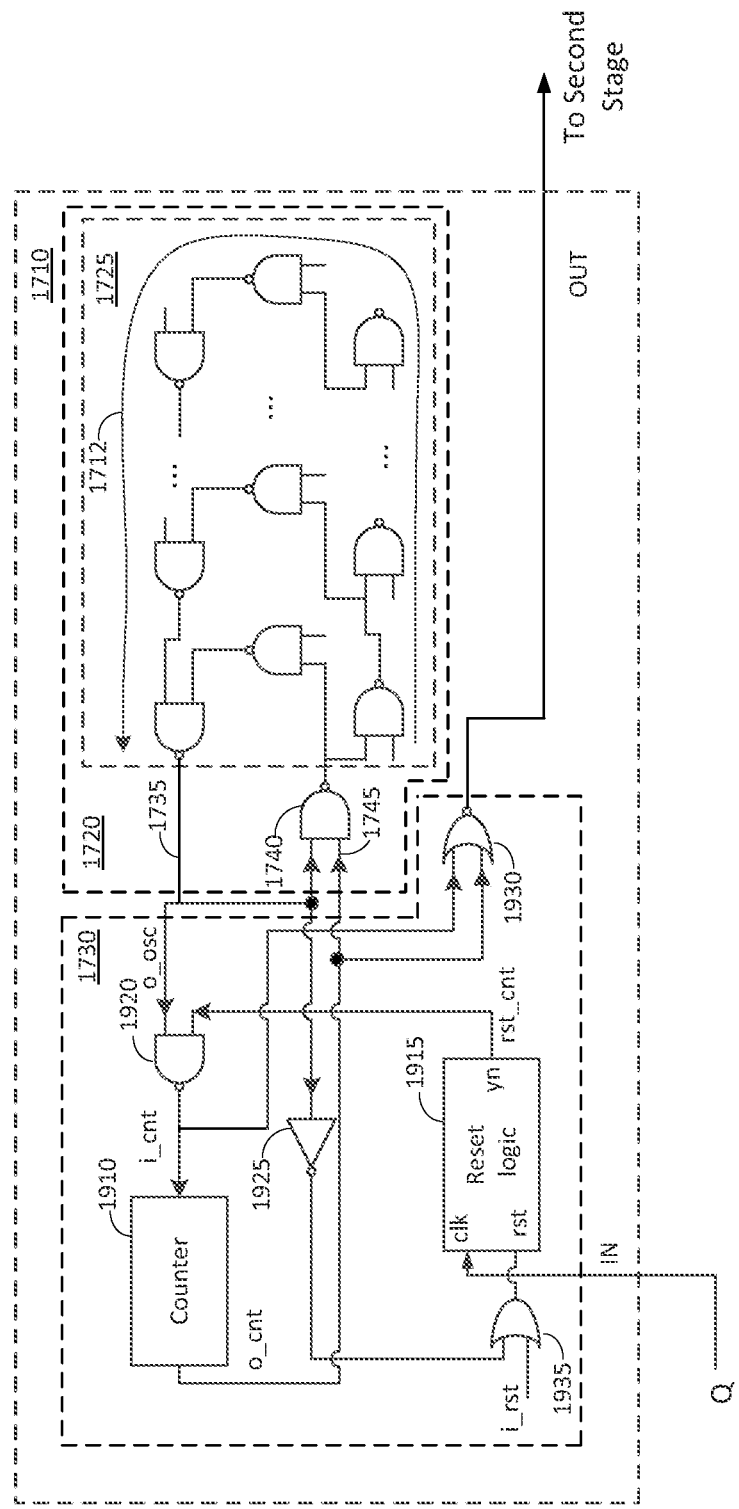
FIG. 19 shows an exemplary implementation of a count circuit according to an embodiment of the present disclosure.

FIG. 19 shows an exemplary implementation of the count circuit 1730 in the first delay stage 1710 according to embodiment of the present disclosure. The count circuit 1780 in the second delay stage 1750 may also be implemented using the circuit shown in FIG. 19.

In this embodiment, the count circuit 1730 comprises reset logic 1915, a counter 1910, a NAND gate 1920, a NOR gate 1930, an inverter 1925, and an OR gate 1935. In the following description, the NAND gate 1920 in the count circuit 1730 will be referred to as the second NAND gate 1920 and the NAND gate 1740 used to enable/disable the oscillator 1720 will be referred to as the first NAND gate 1740.

The second NAND gate 1920 has a first input coupled to the output (denoted "o_osc") of the delay circuit 1725, and a second input coupled to an output (denoted "rst_cnt") of the reset logic 1915. The counter 1910 has an input (denoted "i_cnt") coupled to the output of the second NAND gate 1920, and an output (denoted "o_cnt") coupled to the control input 1745 of the first NAND gate 1740. Thus, in this embodiment, the logic state of the output (o_cnt) of the counter 1910 controls whether the oscillator 1720 is enabled or disabled. The OR gate 1935 has a first input for receiving the initial reset signal (denoted "i_rst") and a second input coupled to the output (o_osc) of the delay circuit 1725 through the inverter 1925. The output of the OR gate 1935 is coupled to a reset input (denoted "rst") of the reset logic 1915. The NOR gate 1930 has a first input coupled to the input (i_cnt) of the counter 1910 and a second input coupled to the output (o_cnt) of the counter 1910.

Exemplary operations of the count circuit 1730 will now be described according to embodiments of the present disclosure. In this example, it may be assumed that the first delay stage 1710 receives low Q pulses from the update circuit 712 (an example of which is shown in FIG. 10). Prior to receiving a rising edge of a Q pulse from the update circuit 712, the oscillator 1720 is disabled (i.e., the counter 1910 outputs (o_cnt) a logic zero to the control input 1745 of the first NAND gate 1740), and the delay circuit 1725 outputs (o_osc) a logic one to the second NAND gate 1920. The reset logic 1915 outputs (rst_cnt) a logic one to the second NAND gate 1920. Thus, the second NAND gate 1920 receives a logic one from both the delay circuit 1725 and the reset logic 1915, causing the second NAND gate 1920 to output a logic zero to the input (i_cnt) of the counter 1910. Since both the input (i_cnt) and output (o_cnt) of the counter 1910 are logic zero, the NOR gate 1930 outputs a logic one.

On the rising edge of the Q pulse, the output (rst_cnt) of the reset logic 1915 transitions from high to low. This causes the second NAND gate 1920 to output a logic one to the input (i_cnt) of the counter 1910, which triggers the counter 1910 to begin counting. In response, the counter 1910 outputs (o_cnt) a logic one to the control input 1745 of the first NAND gate 1740, enabling the oscillator 1720. Thus, the counter 1910 enables the oscillator 1720 in response to the output (rst_cnt) of the reset logic 1915 going low. Further, the logic one at the output (o_cnt) of the counter 1910 (which is also fed to the NOR gate 1930) causes the output of the NOR gate 1930 to transition from high to low.

When the output (o_osc) of the delay circuit 1725 first changes to logic zero in the oscillating mode, a logic one is input to the reset input (rst) of the reset logic 1915 through the inverter 1925 and the OR gate 1935. This causes the reset logic 1915 to reset and output a logic one to the second NAND gate 1920. The logic one from the reset logic 1915 causes the second NAND gate 1920 to pass the inverse of the output (o_osc) of the delay circuit 1725 to the input (i_cnt) of the counter 1910.

As the oscillator 1720 oscillates, the logic state at the output (o_osc) of the delay circuit 1725 changes. The time between changes in the output logic state is approximately equal to the delay of one trip through the first NAND gate 1740 and the path 1712 in the delay circuit 1725.

During oscillation, the counter 1910 increments a count value each time the counter input (i_cnt) rises from low to high (i.e., each rising edge at the output of the NAND gate 1920). This occurs each time a signal makes two trips through the first NAND gate 1740 and the path 1712 in the delay circuit 1725. Thus, in this aspect, the counter 1910 increments the count value after a delay of two trips through the first NAND gate 1740 and the path 1712 in the delay circuit 1725. For the example where the delay through the first NAND gate 1740 and the path 1712 in the delay circuit 1725 equals 16.5*td, the counter 1910 increments the count value after a delay of 2*16.5*td.

When the count value reaches the terminal count value (e.g., 13 counts), the counter 1910 outputs (o_cnt) a logic zero to both the NOR gate 1930 and the control input 1745 of the first NAND gate 1740. The logic zero at the control input 1745 of the first NAND gate 1740 causes the output of the first NAND gate 1740 to be held constant at logic one, disabling the oscillator 1720. The logic one at the output of the first NAND gate 1740 propagates through the delay circuit 1725, causing the delay circuit 1725 to output (o_osc) a logic one to the second NAND gate 1920. This, in turn, causes the second NAND gate 1920 to output a logic zero to both the NOR gate 1930 and the input (i_cnt) of the counter 1910. As a result, both of the inputs of the NOR gate 1930 are logic zero, causing the output of the NOR gate 1930 to transition from low to high, and hence causing the NOR gate 1930 to output a rising edge to the second delay stage 1750. Thus, the first delay stage 1710 outputs a rising edge to the second delay stage 1750 after the counter 1910 reaches the terminal count value. For the example where the terminal count value is 13 and the delay through the first NAND gate 1740 and the delay circuit 1725 is 16.5*td, the delay between the rising edge of the Q pulse and the rising edge output to the second delay stage 1750 is approximately equal to 13*2*16.5*td.

It is to be appreciated that instead of incrementing the count value on each rising edge at the counter input (i_cnt), as discussed above, the counter 1910 may decrement the counter value on each rising edge. In this case, the counter 1910 may start counting from a predetermined count value, decrement the count value on each rising edge, and trigger the second clock delay circuit 1710 when the count value reaches a terminal count value of zero.

Figure 20:
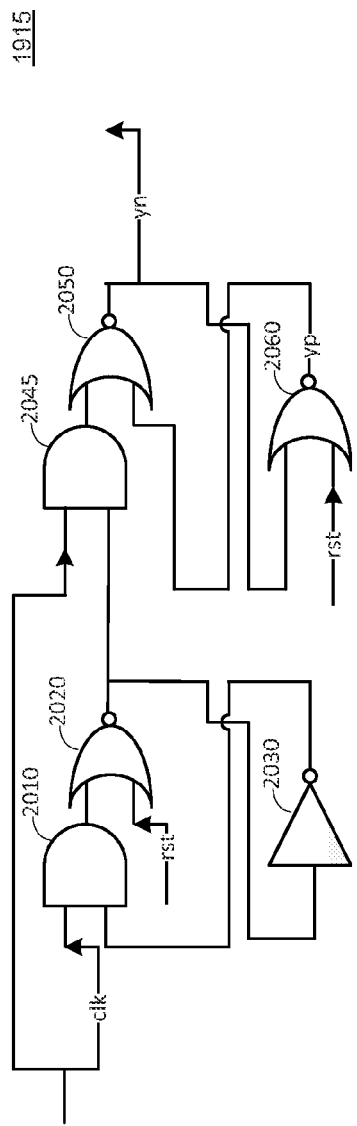
FIG. 20 shows an exemplary implementation of reset logic according to an embodiment of the present disclosure.

FIG. 20 shows an exemplary implementation of the reset logic 1915 according to an embodiment of the present disclosure. The reset logic 1915 comprises a first AND gate 2010, a first NOR gate 2020, an inverter 2030, a second AND gate 2040, a second NOR gate 2050, and a third NOR gate 2060. The clock input (denoted "clk") of the reset logic 1915 is coupled to a first input of the first AND gate 2010 and a first input of the second AND gate 2040. The output of the first AND gate 2010 is coupled to a first input of the first NOR gate 2020, and the reset input is coupled to a second input of the first NOR gate 2020. The output of the first NOR gate 2020 is fed back to a second input of the first AND gate 2010 through the inverter 2030. The output of the first NOR gate 2020 is also coupled to a second input of the second AND gate 2040. The output of the second AND gate 2040 is coupled to a first input of the second NOR gate 2050. The output of second NOR gate 2050 is coupled to a first input of third NOR gate 2060, and the reset input is coupled to a second input of the third NOR gate 2060. The output of third NOR gate 2060 is coupled to a second input of second NOR gate 2050. The output of the second NOR gate 2050 is coupled to the output (denoted "yn") of the reset logic 1915.

The reset logic 1915 may be reset by inputting a logic one to the reset input (rst). Once reset, the reset logic 1915 may output (yn) a logic one until a rising edge is received at the clock input (clk). When the reset logic 1915 is used in the first delay stage 1710, the clock input (clk) may be coupled to the Q output of the update circuit 712, and, when the reset logic 1915 is used in the second delay stage 1750, the clock input (clk) may be coupled to the output of the first delay stage 1710.

When a rising edge is received at the clock input (clk), the output of the reset logic 1915 goes low (i.e., the reset logic 1915 outputs a logic zero). As discussed above, this may trigger the counter 1910 in the count circuit 1730 to start counting. The reset logic 1915 may be reset when the output (o_osc) of the delay circuit 1725 goes low. This is because the output (o_osc) of the delay circuit 1725 is fed to the reset input (rst) of the reset logic 1915 through the inverter 1925. When the reset logic 1915 is used in the first delay stage 1710, this resets the reset logic 1915 for the rising edge of the next Q pulse.

Figure 21:
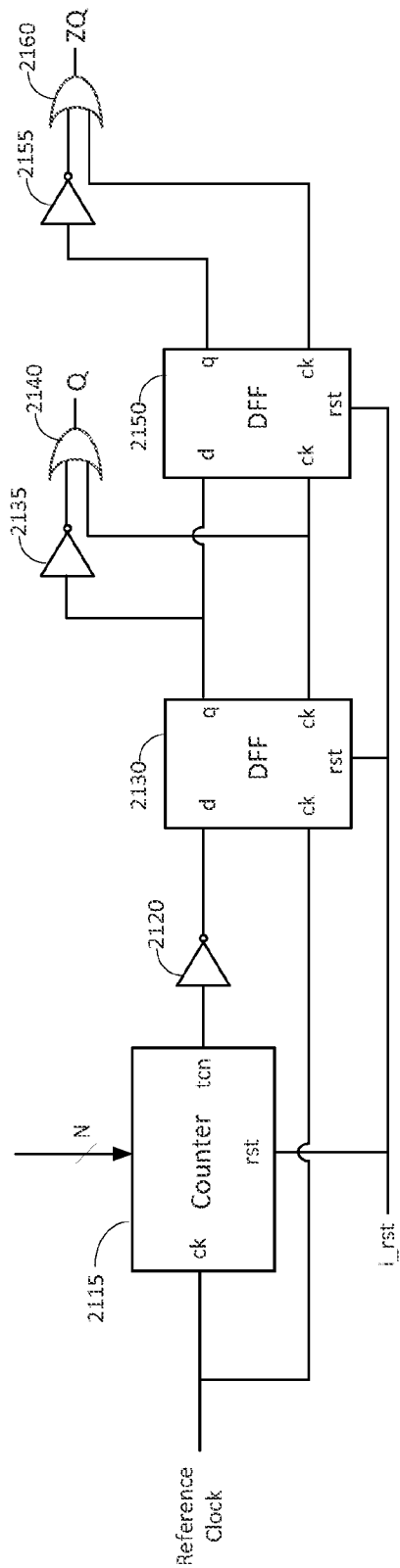
FIG. 21 shows an exemplary implementation of an update circuit according to another embodiment of the present disclosure.

FIG. 21 shows an exemplary implementation of an update circuit 2110 according to an embodiment of the present disclosure. The update circuit 2110 may be used to implement the update circuit 712 shown in FIGS. 7 and 16. The update circuit 2110 is configured to output a pair of pulses every N periods (cycles) of the input reference clock. Each pair of pulses comprises a low Q pulse and a low ZQ pulse (example of which are shown in FIG. 10), in which the ZQ pulse is delayed by approximately one clock period relative to the Q pulse.

The update controller 2110 comprises a programmable counter 2115, a first inverter 2120, a first D flip-flop 2130, a second D flip-flop 2150, a second inverter 2135, a first OR gate 2140, a third inverter 2155, and a second OR gate 2160. The counter 2115, the first flip-flop 2130, and the second flip-flop 2150 may be reset by the initial reset signal (i_rst), as shown in FIG. 21.

The counter 2115 receives the control signal N from the update controller 750 and the reference clock. The counter 2115 is configured to output a logic zero at its output (denoted "tcn") during every Nth period (cycle) of the reference clock, and to output a logic one at its output (tcn) between every Nth period (cycle) for N greater than one.

The first flip-flop 2130 has a clock input (denoted "clk") coupled to the reference clock, a d input coupled to the output (tcn) of the counter 2115 through the first inverter 2120, and a q output. The second flip-flop 2150 has a clock input (denoted "clk") coupled to the reference clock, a d input coupled to the q output of the first flip-flop 2130, and a q output. Both flip-flops 2130 and 2150 may be positive-edge triggered flip-flops, in which each flip-flop latches the logic value at the respective d input on a rising edge of the reference clock and outputs the latched logic value at the respective q output for approximately one clock period.

The first OR gate 2140 has a first input coupled to the q output of the first flip-flop 2130 through the second inverter 2135, and a second input coupled to the reference clock. The output of the first OR gate 2140 forms the Q output of the update circuit 2110. The second OR gate 2160 has a first input coupled to the q output of the second flip-flop 2150 through the third inverter 2155, and a second input coupled to the reference clock. The output of the second OR gate 2160 forms the ZQ output of the update circuit 2110.

Operations of the update circuit 2110 will now be described according to embodiments of the present disclosure.

As discussed above, the counter 2115 outputs a logic zero during every Nth period (cycle) of the reference clock. Each time the counter 2115 outputs a logic zero for one clock period (cycle), the first OR gate 2140 and the second OR gate 2160 output a low Q pulse and a low ZQ pulse, respectively, in which the ZQ pulse is delayed with respect to the Q pulse by approximately one clock period. More particularly, the first inverter 2120 inverts the logic zero at the output (tcn) of the counter 2115, and outputs a logic one to the d input of the first flip-flop 2130. The first flip-flop 2130 latches the logic one on a rising edge of the reference clock, and outputs the latched logic one at its q output for one clock period. The second inverter 2135 inverts the logic one at the q output of the first flip-flop 2130, and outputs a logic zero to the first input of the first OR gate 2140. This causes the first OR gate 2140 to pass the reference clock to the Q output for one clock period to generate a low Q pulse.

The second flip-flop 2150 latches the logic one at the q output of the first-flop 2130 after a delay of one clock period, and outputs the latched logic one for one clock period. The third inverter 2155 inverts the logic one at the q output of the second flip-flop 2150, and outputs a logic zero to the first input of the second OR gate 2160. This causes the second OR gate 2160 to pass the reference clock to the ZQ output for one clock period to generate a low ZQ pulse. Since the q output of the second flip-flop 2150 is delayed by one clock period with respect to the q output of the first flip-flop 2130, the ZQ pulse is delayed with respect to the Q pulse by one clock period.

Figure 22:
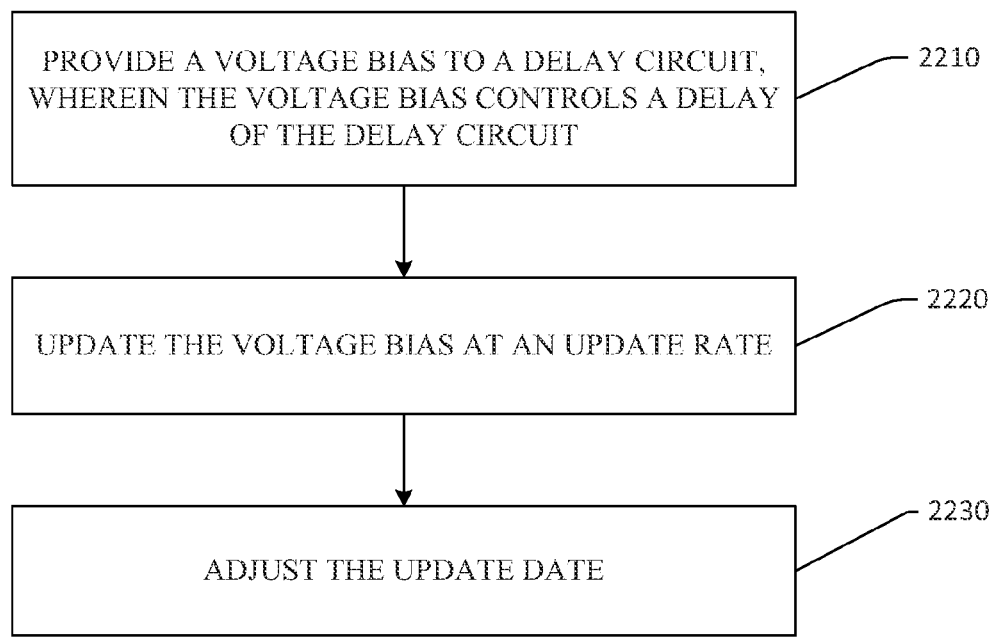
FIG. 22 is a flow diagram illustrating a method for delay control according to an embodiment of the present disclosure.

FIG. 22 is a flow diagram illustrating a method 2200 for delay control according to an embodiment of the present disclosure. The method 2200 may be performed by the master delay circuit 1610 and the update controller 750.

In step 2210, a voltage bias is provided to a delay circuit, wherein the voltage bias controls a delay of the delay circuit. For example, a master delay circuit (e.g., master delay circuit 1610) may provide a voltage bias to a slave delay circuit (e.g., slave delay circuit 1315) to control a step delay of the slave delay circuit.

In step 2220, the voltage bias is updated at an update rate. For example, the voltage bias may be adjusted at a rate of one update per N periods (cycles) of a reference clock.

In step 2230, the update rate is adjusted. For example, the update rate may be adjusted based on timing requirements of a memory interface incorporating the delay circuit. In this example, the update rate may be reduced when the timing requirements are more relaxed (e.g., lower data rates) to reduce power, and may be increased when the timing requirements are tighter (e.g., higher data rates).

The method may optionally include adjusting the update rate based on a data rate of a signal being delayed by the delay circuit. For example, the update rate may be set to a first update rate if the data rate of the signal approximately equals a first data rate, and to the update rate may be set to a second update rate if the data rate of the signal approximately equals a second data rate, wherein the first data rate is lower than the second data rate, and the first update rate is lower than the second update rate.

The method may optionally include providing a second voltage bias (e.g., voltage bias Vbp) to the delay circuit and updating the second voltage bias at the update rate. The second voltage bias may also control the delay of the delay circuit.

It is to be appreciated that the update controller 750 may be implemented with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may perform the functions of the update controller 750 described herein by executing software comprising code for performing the functions. The software may be stored on a computer-readable storage medium, such as a RAM, a ROM, an EEPROM, an optical disk, and/or a magnetic disk.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. For example, although embodiments of the present disclosure are discussed above using an example of a DRAM, it is to be appreciated that embodiments of the present disclosure are not limited to this example, and may be used with other types of memory devices. Thus, the disclosure is not intended to be limited to the examples described herein but is to be accorded the widest scope consistent with the principles and novel features disclosed herein.

What is claimed is:

1. A delay system, comprising:
a delay locked loop (DLL) having an input and an output, wherein the DLL is configured to receive a reference clock at the input, to generate a voltage bias based on the reference clock, to output the voltage bias at the output, wherein the output is coupled to a delay circuit and the voltage bias controls a delay of the delay circuit, and to update the voltage bias at an update rate; and
an update controller configured to adjust the update rate of the DLL.

2. The delay system of claim 1, wherein the update controller is configured to adjust the update rate based on a data rate of a signal being delayed by the delay circuit.

3. A delay system, comprising:
a first delay circuit configured to provide a voltage bias to a second delay circuit, wherein the voltage bias controls a delay of the second delay circuit, and to update the voltage bias at an update rate; and
an update controller configured to adjust the update rate based on a data rate of a signal being delayed by the second delay circuit, wherein the update controller is configured to set the update rate to a first update rate if the data rate of the signal approximately equals a first data rate, and to set the update rate to a second update rate if the data rate of the signal approximately equals a second data rate, wherein the first data rate is lower than the second data rate, and the first update rate is lower than the second update rate.

4. The delay system of claim 1, wherein the update rate is approximately equal to one update of the voltage bias per N periods of the reference clock, N is an integer, and the update controller is configured to adjust N.

5. A delay system, comprising:
a first delay circuit configured to provide a voltage bias to a second delay circuit, wherein the voltage bias controls a delay of the second delay circuit, and to update the voltage bias at a rate approximately equal to one update of the voltage bias per N periods of a reference clock, wherein N is an integer; and
an update controller configured to adjust N, wherein the update controller is configured to set N to a first value if a data rate of a signal being delayed by the second delay circuit approximately equals a first data rate, and to set N to a second value if the data rate of the signal approximately equals a second data rate, wherein the first data rate is lower than the second data rate, and the first value of N is greater than the second value of N.

6. A delay system, comprising:
a first delay circuit configured to provide a voltage bias to a second delay circuit, wherein the voltage bias controls a delay of the second delay circuit, the first delay circuit comprising:
an update circuit configured to generate, from a reference clock, pulse pairs at an update rate, wherein each pulse pair comprises a first pulse and a second pulse, and the first pulse is delayed relative to the second pulse by approximately one period of the reference clock;
a voltage-controlled delay circuit configured to delay the second pulse of each pulse pair by an amount controlled by the voltage bias;
a phase frequency detector configured to detect, for each pulse pair, a phase error between the respective first pulse and the respective delayed second pulse; and
a voltage bias controller configured to update the voltage bias for each pulse pair based on the respective detected phase error; and
an update controller configured to adjust the update rate of the update circuit.

7. The delay system of claim 6, wherein the update circuit is configured to generate the pulse pairs at a rate of one pulse pair per N periods of the reference clock, N is an integer, and the update controller is configured to adjust N.

8. The delay system of claim 7, wherein the update controller is configured to set N to a first value if a data rate of a signal being delayed by the second delay circuit approximately equals a first data rate, and to set N to a second value if the data rate of the signal approximately equals a second data rate, wherein the first data rate is lower than the second data rate, and the first value of N is greater than the second value of N.

9. The delay system of claim 1, wherein the delay of the delay circuit controlled by the voltage bias is a step delay of the delay circuit, and the delay circuit is configured to delay a signal by a multiple of the step delay.

10. A method for delay control, comprising:
generating a voltage bias based on a reference clock using a delay locked loop (DLL);
outputting the voltage bias from the DLL to a delay circuit, wherein the voltage bias controls a delay of the delay circuit;
updating the voltage bias at an update rate; and
adjusting the update rate.

11. The method of claim 10, wherein adjusting the update rate comprises adjusting the update rate based on a data rate of a signal being delayed by the delay circuit.

12. A method for delay control, comprising:
providing a voltage bias to a delay circuit, wherein the voltage bias controls a delay of the delay circuit;
updating the voltage bias at an update rate; and
adjusting the update rate based on a data rate of a signal being delayed by the delay circuit, wherein adjusting the update rate comprises:
setting the update rate to a first update rate if the data rate of the signal approximately equals a first data rate; and
setting the update rate to a second update rate if the data rate of the signal approximately equals a second data rate;
wherein the first data rate is lower than the second data rate, and the first update rate is lower than the second update rate.

13. The method of claim 10, wherein the update rate is approximately equal to one update of the voltage bias per N periods of the reference clock, N is an integer, and adjusting the update rate comprises adjusting N.

14. A method for delay control, comprising:
providing a voltage bias to a delay circuit, wherein the voltage bias controls a delay of the delay circuit;
updating the voltage bias at an update rate approximately equal to one update of the voltage bias per N periods of a reference clock, wherein N is an integer; and
adjusting N, wherein adjusting N comprises:
setting N to a first value if a data rate of a signal being delayed by the delay circuit approximately equals a first data rate; and
setting N to a second value if the data rate of the signal approximately equals a second data rate;
wherein the first data rate is lower than the second data rate, and the first value of N is greater than the second value of N.

15. A method for delay control, comprising:
generating, from a reference clock, pulse pairs at an update rate, wherein each pulse pair comprises a first pulse and a second pulse, and the first pulse is delayed relative to the second pulse by approximately one period of the reference clock;
delaying the second pulse of each pulse pair by an amount controlled by a voltage bias;
detecting, for each pulse pair, a phase error between the respective first pulse and the respective delayed second pulse;

updating the voltage bias for each pulse pair based on the respective detected phase wherein the voltage bias is provided to a delay circuit, and the voltage bias controls a delay of the delay circuit; and
adjusting the update rate.

16. The method of claim 10, further comprising:
providing a second voltage bias to the delay circuit, wherein the second voltage bias also controls the delay of the delay circuit; and
updating the second voltage bias at the update rate.

17. An apparatus for delay control, comprising:
means for generating a voltage bias based on a reference clock using a delay locked loop (DLL);
means for outputting the voltage bias from the DLL to a delay circuit, wherein the voltage bias controls a delay of the delay circuit;
means for updating the voltage bias at an update rate; and
means for adjusting the update rate.

18. The apparatus of claim 17, wherein the means for adjusting the update rate comprises means for adjusting the update rate based on a data rate of a signal being delayed by the delay circuit.

19. An apparatus for delay control, comprising:
means for providing a voltage bias to a delay circuit, wherein the voltage bias controls a delay of the delay circuit;
means for updating the voltage bias at an update rate; and
means for adjusting the update rate based on a data rate of a signal being delayed by the delay circuit, wherein the means for adjusting the update rate comprises:
means for setting the update rate to a first update rate if the data rate of the signal approximately equals a first data rate; and
means for setting the update rate to a second update rate if the data rate of the signal approximately equals a second data rate;
wherein the first data rate is lower than the second data rate, and the first update rate is lower than the second update rate.

20. The apparatus of claim 17, wherein the update rate is approximately equal to one update of the voltage bias per N periods of the reference clock, N is an integer, and the means for adjusting the update rate comprises means for adjusting N.

21. An apparatus for delay control, comprising:
means for providing a voltage bias to a delay circuit, wherein the voltage bias controls a delay of the delay circuit;
means for updating the voltage bias at an update rate approximately equal to one update of the voltage bias per N periods of a reference clock, wherein N is an integer; and
means for adjusting N, wherein the means for adjusting N comprises:
means for setting N to a first value if a data rate of a signal being delayed by the delay circuit approximately equals a first data rate; and
means for setting N to a second value if the data rate of the signal approximately equals a second data rate;
wherein the first data rate is lower than the second data rate, and the first value of N is greater than the second value of N.

22. An apparatus for delay control, comprising:
means for generating, from a reference clock, pulse pairs at an update rate, wherein each pulse pair comprises a first pulse and a second pulse, and the first pulse is delayed relative to the second pulse by approximately one period of the reference clock;

means for delaying the second pulse of each pulse pair by an amount controlled by a voltage bias;

means for detecting, for each pulse pair, a phase error between the respective first pulse and the respective delayed second pulse;

means for updating the voltage bias for each pulse pair based on the respective detected phase error, wherein the voltage bias is provided to a delay circuit, and the voltage bias controls a delay of the delay circuit; and means for adjusting the update rate.

23. The apparatus of claim 17, further comprising:

means for providing a second voltage bias to the delay circuit, wherein the second voltage bias also controls the delay of the delay circuit; and means for updating the second voltage bias at the update rate.

24. A memory interface, comprising:

a delay circuit configured to delay a signal, wherein the signal comprises one of a data signal and a data strobe signal;

a delay locked loop (DLL) having an input and an output, wherein the DLL is configured to receive a reference clock at the input, to generate a voltage bias based on the reference clock, to output the voltage bias at the output, wherein the output is coupled to the delay circuit and the voltage bias controls a delay of the delay circuit, and to update the voltage bias at an update rate; and an update controller configured to adjust the update rate of the DLL.

25. The memory interface of claim 24, wherein the update controller is configured to adjust the update rate based on a data rate of the signal.

26. A memory interface, comprising:

a first delay circuit configured to delay a signal, wherein the signal comprises one of a data signal and a data strobe signal;

a second delay circuit configured to provide a voltage bias to the first delay circuit, wherein the voltage bias controls a delay of the first delay circuit, and to update the voltage bias at an update rate; and an update controller configured to adjust the update rate of the second delay circuit based on a data rate of the signal, wherein the update controller is configured to set the update rate to a first update rate if the data rate of the signal approximately equals a first data rate, and to set the update rate to a second update rate if the data rate of the signal approximately equals a second data rate, wherein the first data rate is lower than the second data rate, and the first update rate is lower than the second update rate.

27. The memory interface of claim 24, wherein the update rate is approximately equal to one update of the voltage bias per N periods of the reference clock, N is an integer, and the update controller is configured to adjust N.

28. A memory interface, comprising:

a first delay circuit configured to delay a signal, wherein the signal comprises one of a data signal and a data strobe signal;

a second delay circuit configured to provide a voltage bias to the first delay circuit, wherein the voltage bias controls a delay of the first delay circuit, and to update the voltage bias at an update rate approximately equals one update of the voltage bias per N periods of a reference clock, wherein N is an integer; and an update controller configured to adjust N, wherein the update controller is configured to set N to a first value if a data rate of the signal approximately equals a first data rate, and to set N to a second value if the data rate of the signal approximately equals a second data rate, wherein the first data rate is lower than the second data rate, and the first value of N is greater than the second value of N.

29. A memory interface, comprising:

a first delay circuit configured to delay a signal, wherein the signal comprises one of a data signal and a data strobe signal;

a second delay circuit configured to provide a voltage bias to the first delay circuit, wherein the voltage bias controls a delay of the first delay circuit, the second delay circuit comprising:

an update circuit configured to generate, from a reference clock, pulse pairs at an update rate, wherein each pulse pair comprises a first pulse and a second pulse, and the first pulse is delayed relative to the second pulse by approximately one period of the reference clock;

a voltage-controlled delay circuit configured to delay the second pulse of each pulse pair by an amount controlled by the voltage bias;

a phase frequency detector configured to detect, for each pulse pair, a phase error between the respective first pulse and the respective delayed second pulse; and a voltage bias controller configured to update the voltage bias for each pulse pair based on the respective detected phase; and an update controller configured to adjust the update rate of the update circuit.

30. The memory interface of claim 24, wherein the delay of the delay circuit controlled by the voltage bias is a step delay of the delay circuit, and the delay circuit is configured to delay the signal by a multiple of the step delay.

* * * * *